US012315460B2

(12) United States Patent
Zeng et al.

(10) Patent No.: US 12,315,460 B2
(45) Date of Patent: *May 27, 2025

(54) DISPLAY SUBSTRATE, DISPLAY DEVICE, AND MANUFACTURING METHOD OF DISPLAY SUBSTRATE

(71) Applicants: Chengdu BOE Optoelectronics Technology Co., Ltd., Chengdu (CN); BOE TECHNOLOGY GROUP CO., LTD., Beijing (CN)

(72) Inventors: Chao Zeng, Beijing (CN); Weiyun Huang, Beijing (CN); Yue Long, Beijing (CN); Yao Huang, Beijing (CN); Meng Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,715

(22) Filed: Dec. 13, 2023

(65) Prior Publication Data

US 2024/0112639 A1 Apr. 4, 2024

Related U.S. Application Data

(63) Continuation of application No. 16/957,984, filed as application No. PCT/CN2019/101835 on Aug. 21, 2019, now Pat. No. 11,887,512.

(51) Int. Cl.
*G09G 3/32* (2016.01)
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01); *G09G 2310/0286* (2013.01)

(58) Field of Classification Search
CPC ................. G09G 3/3611–3644; G09G 3/3266
See application file for complete search history.

(56) References Cited

U.S. PATENT DOCUMENTS 11,887,512 B2 * 1/2024 Zeng ...................... G11C 19/28
2004/0217935 A1 11/2004 Jeon et al.
(Continued)

FOREIGN PATENT DOCUMENTS

CN 108182921 A 6/2018
CN 109037242 A 12/2018
(Continued)

OTHER PUBLICATIONS

International Search Report of PCT/CN2019/101835 in Chinese, mailed May 27, 2020 with English translation.
(Continued)

*Primary Examiner* — Roy P Rabindranath
(74) *Attorney, Agent, or Firm* — Collard & Roe, P.C.; William Collard

(57) ABSTRACT

A display substrate and a manufacturing method thereof, and a display device are provided. The display substrate includes a base substrate, a gate driving circuit, power lines, a first signal line group, and a second signal line group. The gate driving circuit includes cascaded shift register units; the power lines are configured to provide power signals to the shift register units; the first signal line group includes at least one clock signal line, and the clock signal line is configured to provide a clock signal to the shift register units; the second signal line group includes a trigger signal line, and the trigger signal line is configured to provide a trigger (Continued)

signal to a first-stage shift register unit; and the gate driving circuit includes at least one transistor, and an extending direction of a channel of the transistor is parallel to an extending direction of the clock signal line.

20 Claims, 5 Drawing Sheets

(56) References Cited

U.S. PATENT DOCUMENTS

| | | |
|---|---|---|
| 2007/0197019 A1 | 8/2007 | Kang et al. |
| 2010/0270599 A1 | 10/2010 | Kuo et al. |
| 2014/0064438 A1* | 3/2014 | Wu .............. G09G 3/3225 377/64 |
| 2016/0328037 A1 | 11/2016 | Zhuang et al. |
| 2017/0148392 A1 | 5/2017 | Kim |
| 2019/0378462 A1* | 12/2019 | Chung ............. G11C 19/28 |
| 2020/0044092 A1 | 2/2020 | Feng et al. |
| 2020/0052005 A1 | 2/2020 | Yoshida |
| 2020/0342808 A1 | 10/2020 | Han et al. |

FOREIGN PATENT DOCUMENTS

| | | |
|---|---|---|
| CN | 109584799 A | 4/2019 |
| CN | 209265989 U | 8/2019 |
| WO | 2018155347 A1 | 8/2018 |

OTHER PUBLICATIONS

Notice of Transmittal of the International Search Report of PCT/CN2019/101835 in Chinese, mailed .May 27, 2020.
Written Opinion of the International Searching Authority of PCT/CN2019/101835 in Chinese, mailed May 27, 2020 with English translation.
U.S. Office Action in U.S. Appl. No. 16/957,984 dated Feb. 9, 2023.
U.S. Final Office Action in U.S. Appl. No. 16/957,984 dated Jun. 29, 2023.
U.S. Notice of Allowance in U.S. Appl. No. 16/957,984 dated Sep. 13, 2023.
Corrected Notice of Allowability in U.S. Appl. No. 16/957,984 dated Sep. 29, 2023.
Extended European Search Report in European Application No. 19933221.4 dated Aug. 8, 2022.

* cited by examiner

DISPLAY SUBSTRATE, DISPLAY DEVICE, AND MANUFACTURING METHOD OF DISPLAY SUBSTRATE

CROSS REFERENCE TO RELATED APPLICATIONS

This application is a continuation application of U.S. patent application Ser. No. 16/957,984 filed on Jun. 25, 2020, which is a U.S. National Phase Entry of International Application No. PCT/CN2019/101835 filed on Aug. 21, 2019. All of the aforementioned patent applications are hereby incorporated by reference in their entireties.

TECHNICAL FIELD

Embodiments of the present disclosure relate to a display substrate, a display device, and a manufacturing method of a display substrate.

BACKGROUND

With continuous improvement of manufacturing process of amorphous silicon thin film transistors or oxide thin film transistors, a gate driving circuit may be directly integrated on an array substrate to form a gate-driver on array (GOA) to drive a pixel array. For example, a GOA composed of a plurality of cascaded shift register units may be used to provide switching-state voltage signals to a plurality of rows of pixel units in the pixel array through gate lines, thereby controlling the plurality of rows of pixel units to be turned on in sequence. Meanwhile, data signals are provided to pixel units of the corresponding row in the pixel array through data lines, so as to form gray voltages required for respective gray levels of the display image in each pixel unit, thereby displaying one frame of image.

SUMMARY

At least an embodiment of the present disclosure provides a display substrate, and the display substrate includes: a base substrate including a pixel array region and a peripheral region, a gate driving circuit, a plurality of power lines, a first signal line group, and a second signal line group; the gate driving circuit, the plurality of power lines, the first signal line group, and the second signal line group are in the peripheral region and on at least one side of the base substrate; the gate driving circuit includes a plurality of cascaded shift register units; the plurality of power lines are configured to provide a plurality of power signals to the plurality of cascaded shift register units included in the gate driving circuit; the first signal line group includes at least one clock signal line, and the at least one clock signal line is configured to provide at least one clock signal to the plurality of cascaded shift register units included in the gate driving circuit; the second signal line group includes a trigger signal line, and the trigger signal line is configured to be connected to a first-stage shift register unit in the plurality of cascaded shift register units included in the gate driving circuit, to provide a trigger signal to the first-stage shift register unit; and the gate driving circuit includes at least one transistor, an extending direction of a channel of the at least one transistor is parallel to an extending direction of the at least one clock signal line, and the extending direction of the at least one clock signal line is a second direction.

For example, in the display substrate provided by at least an embodiment of the present disclosure, the at least one clock signal includes a first clock signal, the plurality of power signals include a first power signal, each of the plurality of cascaded shift register units includes an input control circuit, an output circuit, and an input circuit, the input control circuit is configured to input the first power signal to the output circuit in response to the first clock signal, and the input circuit is configured to input an input signal to the output circuit in response to the first clock signal.

For example, in the display substrate provided by at least an embodiment of the present disclosure, each of the plurality of cascaded shift register units further includes an output terminal, the at least one clock signal further includes a second clock signal, the plurality of power signals further include a second power signal, the output terminal is electrically connected to the output circuit, and the output circuit is configured to output the second clock signal or the second power signal to the output terminal under control of the input signal and the first power signal.

For example, in the display substrate provided by at least an embodiment of the present disclosure, the at least one clock signal line includes a first clock signal line providing the first clock signal and a second clock signal line providing the second clock signal, and the plurality of power lines include a first power line providing the first power signal and a second power line providing the second power signal; the output circuit includes an output sub-circuit, a first output control sub-circuit, and a second output control sub-circuit; the output sub-circuit is electrically connected to the second clock signal line, the output terminal, and a first node, respectively, and the output sub-circuit is configured to output the second clock signal on the second clock signal line to the output terminal under control of a level of the first node; the first output control sub-circuit is electrically connected to the second power line, the output terminal, and a second node, respectively, and the first output control sub-circuit is configured to output the second power signal on the second power line to the output terminal under control of a level of the second node; the second output control sub-circuit is electrically connected to the first node, the second node, a third node, the first clock signal line, the second clock signal line, the first power line, and the second power line, respectively, and the second output control sub-circuit is configured to control the level of the first node and the level of the second node; the input control circuit is electrically connected to the second node and is configured to write the first power signal on the first power line to the second node under control of the first clock signal on the first clock signal line; and the input circuit is electrically connected to the third node and is configured to write the input signal to the third node under control of the first clock signal on the first clock signal line.

For example, in the display substrate provided by at least an embodiment of the present disclosure, the first output control sub-circuit includes a third transistor, a gate electrode of the third transistor is electrically connected to the second node, a first electrode of the third transistor is electrically connected to the second power line, and a second electrode of the third transistor is electrically connected to the output terminal; the second output control sub-circuit includes a fourth transistor, a fifth transistor, a sixth transistor, and a seventh transistor; a gate electrode of the fourth transistor is electrically connected to the second node, a first electrode of the fourth transistor is electrically connected to the second power line, and a second electrode of the fourth transistor is electrically connected to a first electrode of the fifth transistor; a gate electrode of the fifth transistor is electrically connected to the second clock signal line, and a second electrode of the fifth transistor is electrically connected to the third node; a gate electrode of the sixth transistor is electrically connected to the first power line, a first electrode of the sixth transistor is electrically connected to the third node, and a second electrode of the sixth transistor is electrically connected to the first node; a gate electrode of the seventh transistor is electrically connected to the third node, a first electrode of the seventh transistor is electrically connected to the first clock signal line, and a second electrode of the seventh transistor is electrically connected to the second node; and the output sub-circuit includes an eighth transistor, a gate electrode of the eighth transistor is electrically connected to the first node, a first electrode of the eighth transistor is electrically connected to the second clock signal line, and a second electrode of the eighth transistor is electrically connected to the output terminal.

For example, in the display substrate provided by at least an embodiment of the present disclosure, the fourth transistor, the fifth transistor, the sixth transistor, and the seventh transistor are configured as the at least one transistor, an extending direction of a channel of the fourth transistor is a direction from the first electrode of the fourth transistor to the second electrode of the fourth transistor, an extending direction of a channel of the fifth transistor is a direction from the first electrode of the fifth transistor to the second electrode of the fifth transistor, an extending direction of a channel of the sixth transistor is a direction from the first electrode of the sixth transistor to the second electrode of the sixth transistor, and an extending direction of a channel of the seventh transistor is a direction from the first electrode of the seventh transistor to the second electrode of the seventh transistor.

For example, in the display substrate provided by at least an embodiment of the present disclosure, a control terminal of the input control circuit is configured to receive the first clock signal, the control terminal of the input control circuit includes a main body portion, and an extending direction of the main body portion is in a straight line.

For example, in the display substrate provided by at least an embodiment of the present disclosure, the input control circuit includes a first transistor, and a gate electrode of the first transistor is the control terminal of the input control circuit; the gate electrode of the first transistor includes a first gate portion, and the first gate portion is the main body portion; the extending direction of the main body portion is a first direction, and the first direction is perpendicular to the second direction; the first transistor is configured as the at least one transistor, and an extending direction of a channel of the first transistor is a direction from a first electrode of the first transistor to a second electrode of the first transistor; and a distance between an orthographic projection of the first gate portion on the base substrate and an orthographic projection of the first electrode of the first transistor on the base substrate in the second direction is a certain value, and a distance between the orthographic projection of the first gate portion on the base substrate and an orthographic projection of the second electrode of the first transistor on the base substrate in the second direction is a certain value.

For example, in the display substrate provided by at least an embodiment of the present disclosure, the control terminal of the input control circuit further includes a protruding portion, and the protruding portion is electrically connected to the main body portion; the gate electrode of the first transistor further includes a second gate portion, and the second gate portion is the protruding portion; and in the second direction, at least a portion of an orthographic projection of the second gate portion on the base substrate is between the orthographic projection of the first electrode of the first transistor on the base substrate and the orthographic projection of the second electrode of the first transistor on the base substrate.

For example, in the display substrate provided by at least an embodiment of the present disclosure, the first gate portion and the second gate portion are integrally provided.

For example, in the display substrate provided by at least an embodiment of the present disclosure, a control terminal of the input circuit is configured to receive the first clock signal, and an extending direction of the control terminal of the input circuit is in a straight line.

For example, in the display substrate provided by at least an embodiment of the present disclosure, an extending direction of the control terminal of the input control circuit is the first direction.

For example, in the display substrate provided by at least an embodiment of the present disclosure, the input circuit includes a second transistor, the control terminal of the input circuit includes a gate electrode of the second transistor, and the gate electrode of the first transistor and the gate electrode of the second transistor are arranged in the first direction.

For example, in the display substrate provided by at least an embodiment of the present disclosure, each of the plurality of cascaded shift register units further includes a first wiring portion, the first gate portion of the gate electrode of the first transistor is directly connected to a first end of the first wiring portion, the gate electrode of the second transistor is directly connected to a second end of the first wiring portion, and the first wiring portion extends in a straight line along the first direction.

For example, in the display substrate provided by at least an embodiment of the present disclosure, the gate electrode of the first transistor, the gate electrode of the second transistor, and the first wiring portion are integrally provided.

For example, in the display substrate provided by at least an embodiment of the present disclosure, each of the plurality of cascaded shift register units further includes a second wiring portion, the second wiring portion is electrically connected to the first wiring portion, and the second wiring portion extends along the second direction.

For example, in the display substrate provided by at least an embodiment of the present disclosure, the second wiring portion and the first wiring portion are integrally provided.

For example, in the display substrate provided by at least an embodiment of the present disclosure, each of the plurality of cascaded shift register units further includes a third wiring portion, and the third wiring portion extends along the first direction; a first end of the third wiring portion is electrically connected to the first clock signal line, and a second end of the third wiring portion is electrically connected to the gate electrode of the first transistor; and the third wiring portion is configured to transmit the first clock signal provided by the first clock signal line to the gate electrode of the first transistor.

For example, in the display substrate provided by at least an embodiment of the present disclosure, the third wiring portion and the gate electrode of the first transistor are integrally provided.

For example, the display substrate provided by at least an embodiment of the present disclosure further includes a semiconductor layer, a first insulating layer, a first conductive layer, a second insulating layer, a second conductive layer, a third insulating layer, and a third conductive layer, the semiconductor layer is on the base substrate, the first insulating layer is on a side of the semiconductor layer away from the base substrate, the first conductive layer is on a side of the first insulating layer away from the semiconductor layer, the second insulating layer is on a side of the first conductive layer away from the first insulating layer, the second conductive layer is on a side of the second insulating layer away from the first conductive layer, the third insulating layer is on a side of the second conductive layer away from the second insulating layer, and the third conductive layer is on a side of the third insulating layer away from the second conductive layer.

For example, in the display substrate provided by at least an embodiment of the present disclosure, the first electrode of the eighth transistor is electrically connected to the gate electrode of the fifth transistor through a first connection component; the gate electrode of the fifth transistor is in the first conductive layer, and the first connection component is in the third conductive layer; the first connection component is electrically connected to the gate electrode of the fifth transistor through at least one first via hole, and the at least one first via hole is in the second insulating layer and the third insulating layer, and penetrates the second insulating layer and the third insulating layer; and an orthographic projection of the at least one first via hole on the base substrate is on a side of an orthographic projection of the gate electrode of the fifth transistor on the base substrate away from an orthographic projection of the gate electrode of the eighth transistor on the base substrate in a first direction perpendicular to the second direction.

For example, in the display substrate provided by at least an embodiment of the present disclosure, in a case where the at least one first via hole includes a plurality of first via holes, the plurality of first via holes are arranged in the first direction.

For example, in the display substrate provided by at least an embodiment of the present disclosure, the second clock signal line is in the third conductive layer, the gate electrode of the fifth transistor is electrically connected to the second clock signal line through a fourth wiring portion, the fourth wiring portion is in the first conductive layer, the fourth wiring portion is electrically connected to the second clock signal line through a third via hole, and the third via hole is in the second insulating layer and the third insulating layer, and penetrates the second insulating layer and the third insulating layer.

For example, in the display substrate provided by at least an embodiment of the present disclosure, the first electrode of the eighth transistor is in the semiconductor layer, the first electrode of the eighth transistor is electrically connected to the first connection component through a plurality of fourth via holes, and the plurality of fourth via holes are in the first insulating layer, the second insulating layer, and the third insulating layer, and penetrates the first insulating layer, the second insulating layer, and the third insulating layer.

For example, in the display substrate provided by at least an embodiment of the present disclosure, in a case where the input control circuit includes a first transistor, the gate electrode of the fourth transistor is electrically connected to a second electrode of the first transistor and the second electrode of the seventh transistor through a second connection component, a third connection component, and a fourth connection component; the second connection component and the fourth connection component are in the third conductive layer, and the third connection component is in the second conductive layer; the gate electrode of the fourth transistor is in the first conductive layer, the gate electrode of the fourth transistor is electrically connected to the second connection component through a fifth via hole, and the fifth via hole is in the second insulating layer and the third insulating layer, and penetrates the second insulating layer and the third insulating layer; the second connection component is electrically connected to the third connection component through a sixth via hole, and the sixth via hole is in the third insulating layer and penetrates the third insulating layer; the third connection component is electrically connected to the fourth connection component through a seventh via hole, and the seventh via hole is in the third insulating layer and penetrates the third insulating layer; and the second electrode of the first transistor and the second electrode of the seventh transistor are in the semiconductor layer, the second electrode of the first transistor is electrically connected to the fourth connection component through an eighth via hole, the second electrode of the seventh transistor is electrically connected to the fourth connection component through a ninth via hole, and the eighth via hole and the ninth via hole are in the first insulating layer, the second insulating layer, and the third insulating layer, and penetrates the first insulating layer, the second insulating layer, and the third insulating layer.

For example, in the display substrate provided by at least an embodiment of the present disclosure, the fifth via hole and the sixth via hole are arranged in the second direction.

For example, in the display substrate provided by at least an embodiment of the present disclosure, the first clock signal line is in the third conductive layer; in a case where the input control circuit includes a first transistor, a gate electrode of the first transistor is in the first conductive layer; in a case where the input circuit includes a second transistor, a gate electrode of the second transistor is in the first conductive layer; in a case where each of the plurality of cascaded shift register units includes a third wiring portion, the third wiring portion is in the first conductive layer; a first end of the third wiring portion is electrically connected to the first clock signal line through a tenth via hole; and the tenth via hole is in the second insulating layer and the third insulating layer, and penetrates the second insulating layer and the third insulating layer.

At least an embodiment of the present disclosure further provides a display substrate, and the display substrate includes a base substrate and a shift register unit on the base substrate; the shift register unit includes an input circuit, an input control circuit, an output circuit, and an output terminal; the output circuit is electrically connected to the input circuit, the input control circuit, and the output terminal, respectively, and the output circuit is configured to output a second clock signal or a second power signal to the output terminal under control of an input signal provided by the input circuit and a first power signal provided by the input control circuit; the output circuit includes a fourth transistor, a fifth transistor, and an eighth transistor; a gate electrode of the fourth transistor is electrically connected to the input control circuit, a first electrode of the fourth transistor is electrically connected to a second power line, and a second electrode of the fourth transistor is electrically connected to a first electrode of the fifth transistor; a gate electrode of the fifth transistor is electrically connected to a second clock signal line, and a second electrode of the fifth transistor is electrically connected to a gate electrode of the eighth transistor; a first electrode of the eighth transistor is electrically connected to the second clock signal line, and a second electrode of the eighth transistor is electrically connected to the output terminal; the first electrode of the eighth transistor is electrically connected to the gate electrode of the fifth transistor through a first connection component, and the first connection component is electrically connected to the gate electrode of the fifth transistor through at least one first via hole; and an orthographic projection of the at least one first via hole on the base substrate is not between an orthographic projection of the gate electrode of the fifth transistor on the base substrate and an orthographic projection of the gate electrode of the eighth transistor on the base substrate.

For example, the display substrate provided by at least an embodiment of the present disclosure further includes a semiconductor layer, a first insulating layer, a first conductive layer, a second insulating layer, a second conductive layer, a third insulating layer, and a third conductive layer, which are provided on the base substrate in sequence; the gate electrode of the fifth transistor is in the first conductive layer; the first connection component is in the third conductive layer; and the at least one first via hole is in the second insulating layer and the third insulating layer, and penetrates the second insulating layer and the third insulating layer.

For example, in the display substrate provided by at least an embodiment of the present disclosure, the gate electrode of the fourth transistor is in the first conductive layer; the gate electrode of the fourth transistor is electrically connected to a second connection component through a fifth via hole, the second connection component is in the third conductive layer, and the fifth via hole is in the second insulating layer and the third insulating layer, and penetrates the second insulating layer and the third insulating layer; the second connection component is electrically connected to a third connection component through a sixth via hole, the third connection component is in the second conductive layer, and the sixth via hole is in the third insulating layer and penetrates the third insulating layer; the gate electrode of the fourth transistor and the gate electrode of the fifth transistor are arranged in the second direction in the first conductive layer; and an orthographic projection of the fifth via hole on the base substrate and an orthographic projection of the sixth via hole on the base substrate are arranged in the second direction.

For example, in the display substrate provided by at least an embodiment of the present disclosure, in a case where the at least one first via hole includes a plurality of first via holes, the plurality of first via holes are arranged in a first direction, and the first direction is perpendicular to the second direction.

At least an embodiment of the present disclosure further provides a display device, including the display substrate according to any one of the embodiments of the present disclosure.

At least an embodiment of the present disclosure further provides a manufacturing method of the display substrate according to any one of the embodiments of the present disclosure, and the manufacturing method includes: providing the base substrate, and forming a semiconductor layer, a first insulating layer, a first conductive layer, a second insulating layer, a second conductive layer, a third insulating layer, and a third conductive layer in a direction perpendicular to the base substrate in sequence; the plurality of power lines, the first signal line group, and the second signal line group are in the third conductive layer; the gate driving circuit is formed in the semiconductor layer, the first conductive layer, and the second conductive layer; and the gate driving circuit is respectively connected to the plurality of power lines, the first signal line group, and the second signal line group through a plurality of via holes in the first insulating layer, the second insulating layer, and the third insulating layer.

At least an embodiment of the present disclosure further provides a manufacturing method of the display substrate according to any one of the embodiments of the present disclosure, and the manufacturing method includes: forming a first conductive layer on the base substrate, the first conductive layer including the main body portion of the control terminal of the input control circuit.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
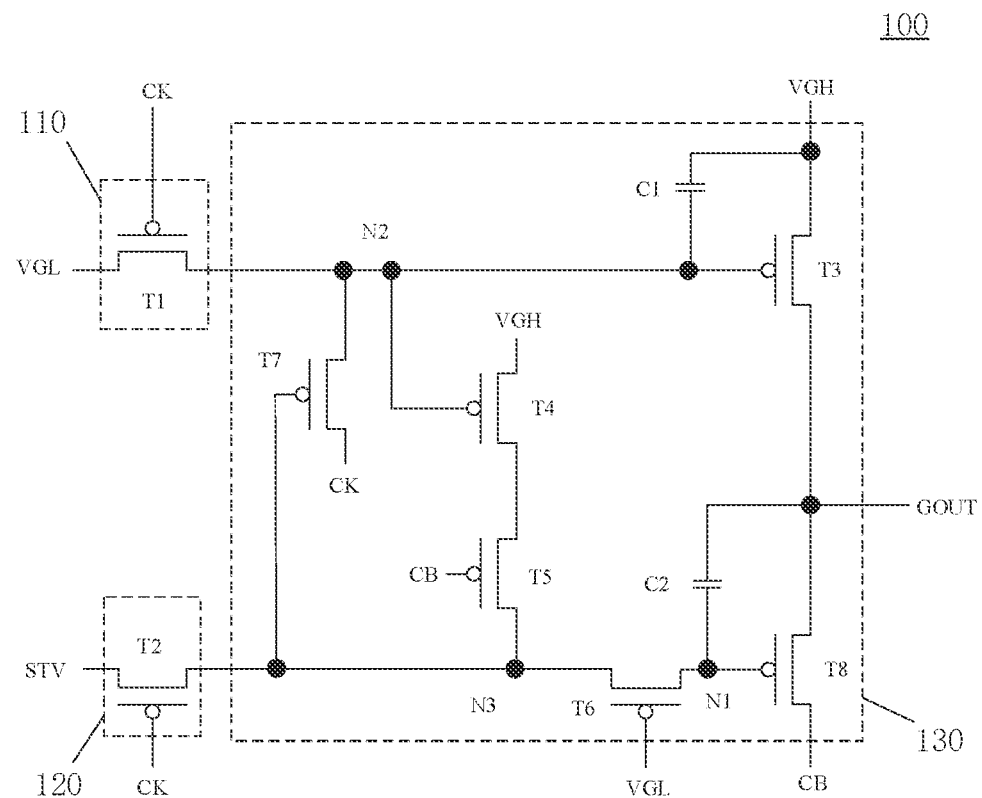
FIG. 1 is a schematic diagram of a circuit structure of a shift register unit of a display substrate provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects.

During the preparation of the display substrate, because of the complex layout structure of the shift register unit in the display substrate, the preparation of such as the gate portion of the transistor in the display substrate is usually easily affected by process fluctuations, thereby affecting the stability of the prepared display substrate, so that it is difficult to implement mass production and application of the display substrate. In addition, the complex layout structure of the shift register unit may further increase the width of the shift register unit in the display substrate, so that it is difficult for the display substrate to achieve a narrow frame design, and the manufacturing cost of the display substrate is also increased.

At least an embodiment of the present disclosure provides a display substrate, and the display substrate includes: a base substrate, a gate driving circuit, a plurality of power lines, a first signal line group, and a second signal line group. The base substrate includes a pixel array region and a peripheral region, and the gate driving circuit, the plurality of power lines, the first signal line group, and the second signal line group are in the peripheral region and on at least one side of the base substrate. The gate driving circuit includes a plurality of cascaded shift register units; the plurality of power lines are configured to provide a plurality of power signals to the plurality of cascaded shift register units included in the gate driving circuit; the first signal line group includes at least one clock signal line, and the at least one clock signal line is configured to provide at least one clock signal to the plurality of cascaded shift register units included in the gate driving circuit; the second signal line group includes a trigger signal line, and the trigger signal line is configured to be connected to a first-stage shift register unit in the plurality of cascaded shift register units included in the gate driving circuit to provide a trigger signal to the first-stage shift register unit; and the gate driving circuit includes at least one transistor, and an extending direction of a channel of the at least one transistor is parallel to an extending direction of the at least one clock signal line.

The layout design of the display substrate may reduce the width of the position occupied by the gate driving circuit in the display substrate by allowing the extending direction of the channel of the at least one transistor to be parallel to the extending direction of the clock signal line, so as to optimize the layout structure of the display substrate, thereby reducing the frame size of the display device including the display substrate to achieve a narrow frame design and further reducing the manufacturing cost of the display substrate and the manufacturing cost of the display device including the display substrate.

For example, in the display substrate provided by at least an embodiment of the present disclosure, the at least one clock signal includes a first clock signal, the plurality of power signals include a first power signal, and each of the shift register units in the gate driving circuit includes an input control circuit and an output circuit. The input control circuit is configured to input the first power signal to the output circuit in response to the first clock signal, and a control terminal of the input control circuit is configured to receive the first clock signal. The control terminal of the input control circuit includes a main body portion, and an extending direction of the main body portion is in a straight line. The layout design of the display substrate may optimize the structure of the display substrate, thereby reducing the influence of process fluctuations on the display substrate during the manufacturing process, and improving the stability of the prepared display substrate.

At least an embodiment of the present disclosure further provides a display device including the above display substrate and a manufacturing method of the above display substrate.

Hereinafter, some embodiments of the present disclosure are described in detail with reference to the accompanying drawings. It should be noted that the same reference numerals used in different drawings refer to the same described components.

At least an embodiment of the present disclosure provides a display substrate, and the display substrate includes: a base substrate, a gate driving circuit, a plurality of power lines, a first signal line group, and a second signal line group. The base substrate includes a pixel array region and a peripheral region, and the gate driving circuit, the plurality of power lines, the first signal line group, and the second signal line group are in the peripheral region and on at least one side of the base substrate. The gate driving circuit includes a plurality of cascaded shift register units; the plurality of power lines are configured to provide a plurality of power signals to the plurality of cascaded shift register units included in the gate driving circuit; the first signal line group includes at least one clock signal line, and the at least one clock signal line is configured to provide at least one clock signal to the plurality of cascaded shift register units included in the gate driving circuit; the second signal line group includes a trigger signal line, and the trigger signal line is configured to be connected to a first-stage shift register unit in the plurality of cascaded shift register units included in the gate driving circuit to provide a trigger signal to the first-stage shift register unit; and the gate driving circuit includes at least one transistor, and an extending direction of a channel of the at least one transistor is parallel to an extending direction of the at least one clock signal line.

In the display substrate provided by at least an embodiment of the present disclosure, the at least one clock signal includes a first clock signal, the plurality of power signals include a first power signal, and each of the shift register units in the gate driving circuit of the display substrate includes an input control circuit and an output circuit. The input control circuit is configured to input the first power signal to the output circuit in response to the first clock signal, and a control terminal of the input control circuit is configured to receive the first clock signal. The control terminal of the input control circuit includes a main body portion, and an extending direction of the main body portion is in a straight line.

For example, in some embodiments of the present disclosure, the display substrate may be an organic light-emitting diode (OLED) display substrate, or may be a quantum dot light-emitting diode (QLED) display substrate, an electronic paper display substrate, or the like, and the embodiments of the present disclosure are not limited in this aspect.

FIG. 1 is a schematic diagram of a circuit structure of a shift register unit of a display substrate provided by some embodiments of the present disclosure.

For example, as illustrated in FIG. 1, the shift register unit 100 includes an input control circuit 110, an input circuit 120, an output circuit 130, and an output terminal GOUT.

For example, a first signal line group of the display substrate includes a first clock signal line CK and a second clock signal line CB, the first clock signal line CK is configured to provide a first clock signal, and the second clock signal line CB is configured to provide a second clock signal. A plurality of power lines include a first power line VGL and a second power line VGH, the first power line VGL is configured to provide a first power signal, and the second power line VGH is configured to provide a second power signal.

For example, the input control circuit 110 is configured to input the first power signal to the output circuit 130 in response to the first clock signal.

For example, as illustrated in FIG. 1, the input control circuit 110 is electrically connected to the first power line VGL, the first clock signal line CK, and a second node N2, respectively. The first power line VGL is configured to provide the first power signal, the first clock signal line CK is configured to provide the first clock signal, and the second node N2 is electrically connected to the output circuit 130. The input control circuit 110 is configured to write the first power signal on the first power line VGL to the second node N2 under control of the first clock signal on the first clock signal line CK. That is, under control of the first clock signal, where the input control circuit 110 is turned on, the first power signal on the first power line VGL may be transmitted to the output circuit 130.

For example, the input control circuit 110 includes a first transistor T1, and a control terminal of the input control circuit 110 includes a gate electrode of the first transistor T1. The gate electrode of the first transistor T1 is electrically connected to the first clock signal line CK to receive the first clock signal, a first electrode of the first transistor T1 is electrically connected to the first power line VGL to receive the first power signal, and a second electrode of the first transistor T1 is electrically connected to the second node N2.

For example, the input circuit 120 is configured to input an input signal to the output circuit 130 in response to the first clock signal.

For example, as illustrated in FIG. 1, the input circuit 120 is electrically connected to an input signal line STV, the first clock signal line CK, and a third node N3, respectively. The input signal line STV is configured to provide the input signal, the first clock signal line CK is configured to provide the first clock signal, and the third node N3 is electrically connected to the output circuit 130. The input circuit 120 is configured to write the input signal on the input signal line STV to the third node N3 under control of the first clock signal on the first clock signal line CK. That is, under control of the first clock signal, in the case where the input circuit 120 is turned on, the input signal on the input signal line STV may be transmitted to the output circuit 130.

For example, the input circuit 120 includes a second transistor T2, and a control terminal of the input circuit 120 includes a gate electrode of the second transistor T2. The gate electrode of the second transistor T2 is electrically connected to the first clock signal line CK to receive the first clock signal, a first electrode of the second transistor T2 is electrically connected to the input signal line STV to receive the input signal, and a second electrode of the second transistor T2 is electrically connected to the third node N3.

It should be noted that, in the example illustrated in FIG. 1, both the gate electrode of the first transistor T1 and the gate electrode of the second transistor T2 are electrically connected to the first clock signal line CK, but the embodiments of the present disclosure are not limited to this. In some examples, the gate electrode of the first transistor T1 and the gate electrode of the second transistor T2 may also be electrically connected to two different signal lines, respectively.

For example, the output circuit 130 is configured to output the second clock signal or the second power signal to the output terminal GOUT under control of the input signal and the first power signal.

For example, as illustrated in FIG. 1, the output circuit 130 is electrically connected to the second node N2, the third node N3, the output terminal GOUT, the first power line VGL, the second power line VGH, the first clock signal line CK, and the second clock signal line CB, respectively. The first power line VGL is configured to provide the first power signal, the second power line VGH is configured to provide the second power signal, and the second clock signal line CB is configured to provide the second clock signal. The output circuit 130 outputs the second clock signal on the second clock signal line CB or the second power signal on the second power line VGH to the output terminal GOUT under control of the input signal written to the third node N3 and the first power signal written to the second node N2. That is, under control of the input signal and the first power signal, in the case where the output circuit 130 allows the second clock signal line CB to be electrically connected to the output terminal GOUT, the second clock signal may be output to the output terminal GOUT as the output signal. Alternatively, in the case where the output circuit 130 allows the second power line VGH to be electrically connected to the output terminal GOUT, the second power signal may be output to the output terminal GOUT as the output signal.

For example, in the case where the gate driving circuit includes a plurality of cascaded shift register units 100 illustrated in FIG. 1, the output terminals GOUT may be electrically connected to corresponding gate lines, so as to control a plurality of rows of pixel units in the pixel array on the display substrate 10 to be sequentially turned on, that is, the output signal of the output terminal GOUT may be used as a switching-state voltage signal for controlling each pixel unit of the display substrate 10.

For example, the output circuit 130 includes an output sub-circuit, a first output control sub-circuit, and a second output control sub-circuit.

For example, as illustrated in FIG. 1, the output sub-circuit is electrically connected to the second clock signal line CB, the output terminal GOUT, and the first node N1, respectively. The output sub-circuit is configured to output the second clock signal on the second clock signal line CB to the output terminal GOUT as the output signal under control of the level of the first node N1.

For example, the output sub-circuit includes an eighth transistor T8, a gate electrode of the eighth transistor T8 is electrically connected to the first node N1, a first electrode of the eighth transistor T8 is electrically connected to the second clock signal line CB to receive the second clock signal, and a second electrode of the eighth transistor T8 is electrically connected to the output terminal GOUT.

For example, the first output control sub-circuit is electrically connected to the second power line VGH, the output terminal GOUT, and the second node N2, respectively. The first output control sub-circuit is configured to output the second power signal on the second power line VGH to the output terminal GOUT as the output signal under control of the level of the second node N2.

For example, the first output control sub-circuit includes a third transistor T3, a gate electrode of the third transistor T3 is electrically connected to the second node N2, a first electrode of the third transistor T3 is electrically connected to the second power line VGH to receive the second power signal, and a second electrode of the third transistor T3 is electrically connected to the output terminal GOUT.

For example, the second output control sub-circuit is electrically connected to the first node N1, the second node N2, the third node N3, the first clock signal line CK, the second clock signal line CB, the first power line VGL, and the second power line VGH, respectively. The second output control sub-circuit is configured to control the level of the first node N1 and the level of the second node N2. For example, in the case where the level of the first node N1 may control the output sub-circuit to be turned on, the output sub-circuit may write the second clock signal to the output terminal GOUT as the output signal; and in the case where the level of the second node N2 may control the first output control sub-circuit to be turned on, the first output control sub-circuit may write the second power signal to the output terminal GOUT as the output signal.

For example, the second output control sub-circuit includes a fourth transistor T4, a fifth transistor T5, a sixth transistor T6, and a seventh transistor T7.

For example, a gate electrode of the fourth transistor T4 is electrically connected to the second node N2, a first electrode of the fourth transistor T4 is electrically connected to the second power line VGH to receive the second power signal, and a second electrode of the fourth transistor T4 is electrically connected to a first electrode of the fifth transistor T5.

For example, a gate electrode of the fifth transistor T5 is electrically connected to the second clock signal line CB to receive the second clock signal, and a second electrode of the fifth transistor T5 is electrically connected to the third node N3.

For example, a gate electrode of the sixth transistor T6 is electrically connected to the first power line VGL to receive the first power signal, a first electrode of the sixth transistor T6 is electrically connected to the third node N3, and a second electrode of the sixth transistor T6 is electrically connected to the first node N1.

For example, a gate electrode of the seventh transistor T7 is electrically connected to the third node N3, a first electrode of the seventh transistor T7 is electrically connected to the first clock signal line CK to receive the first clock signal, and a second electrode of the seventh transistor T7 is electrically connected to the second node N2.

For example, as illustrated in FIG. 1, the output circuit 130 further includes a first storage sub-circuit, and the first storage sub-circuit is used for maintaining the level at the second node N2. For example, the first storage sub-circuit includes a first capacitor C1, a first electrode of the first capacitor C1 is electrically connected to the second node N2, and a second electrode of the first capacitor C1 is electrically connected to the second power line VGH and the first electrode of the third transistor T3.

For example, as illustrated in FIG. 1, the output circuit 130 further includes a second storage sub-circuit, and the second storage sub-circuit is used for maintaining the level at the first node N1. For example, the second storage sub-circuit includes a second capacitor C2, a first electrode of the second capacitor C2 is electrically connected to the first node N1, and a second electrode of the second capacitor C2 is electrically connected to the output terminal GOUT and the second electrode of the eighth transistor T8.

For example, both the first power signal and the second power signal may be direct-current voltage signals. For example, the first power signal is a low-level signal (for example, 0V, −5V, or other voltages), and the second power signal is a high-level signal (for example, 5V, 10V, or other voltages). It should be noted that the low-level signal and the high-level signal are relative, and the low-level signal is smaller than the high-level signal. In different embodiments, values of the high-level signals may be different, and values of the low-level signals may also be different.

It should be noted that the input control circuit 110, the input circuit 120, and the output circuit 130 illustrated in FIG. 1 are only an example of the embodiments of the present disclosure, and the shift register unit of the display substrate provided by the embodiments of the present disclosure includes but is not limited to the case illustrated in FIG. 1.

It should be noted that all the transistors used in the embodiments of the present disclosure may be thin film transistors, field effect transistors, or other switching components with the same characteristics. The source electrode and drain electrode of the transistor used here may be symmetrical in structure, and therefore, the source electrode and drain electrode of the transistor may have no difference in structure. In the embodiments of the present disclosure, in order to distinguish the two electrodes of the transistor except the gate electrode, one of the two electrodes is described as the first electrode, and another of the two electrodes is described as the second electrode, so that the first electrode and the second electrode of all or part of the transistors in the embodiments of the present disclosure may be interchanged as needed. For example, the first electrode of the transistor described in the embodiments of the present disclosure may be the source electrode, and the second electrode of the transistor described in the embodiments of the present disclosure may be the drain electrode. Alternatively, the first electrode of the transistor may be the drain electrode, and the second electrode of the transistor may be the source electrode. In addition, the transistors may be divided into N-type transistors and P-type transistors according to the characteristics. In the case where the transistor is the P-type transistor, the turn-on voltage is a low-level voltage (for example, 0V, −5V, or other values), and the turn-off voltage is a high-level voltage (for example, 5V, 10V, or other values); and in the case where the transistor is the N-type transistor, the turn-on voltage is a high-level voltage (for example, 5V, 10V, or other values), and the turn-off voltage is a low-level voltage (for example, 0V, −5V, or other values).

For example, in the embodiments of the present disclosure illustrated in FIG. 1, all the transistors are P-type transistors.

For example, in the embodiments of the present disclosure illustrated in FIG. 1, the channel of the transistor may correspond to, for example, the channel region between the source region and the drain region of the active layer of the transistor, the distance between the source region and the drain region is the length of the channel of the transistor, and the extending direction of the channel of the transistor is the direction from the first electrode to the second electrode of the transistor. The extending direction of the channel of at least one selected form a group consisting of the first transistor T1 to the eighth transistor 8 is parallel to the extending direction of the clock signal line (for example, the first clock signal line CK and the second clock signal line CB), so that the width of the position occupied by the gate driving circuit including a plurality of cascaded shift register units in the display substrate is reduced, thereby optimizing the layout structure of the display substrate and reducing the frame size of the display device including the display substrate to achieve the narrow frame design.

Hereinafter, the working principle of the shift register unit 100 illustrated in FIG. 1 is described in conjunction with the driving timing diagram illustrated in FIG. 2.

Figure 2:
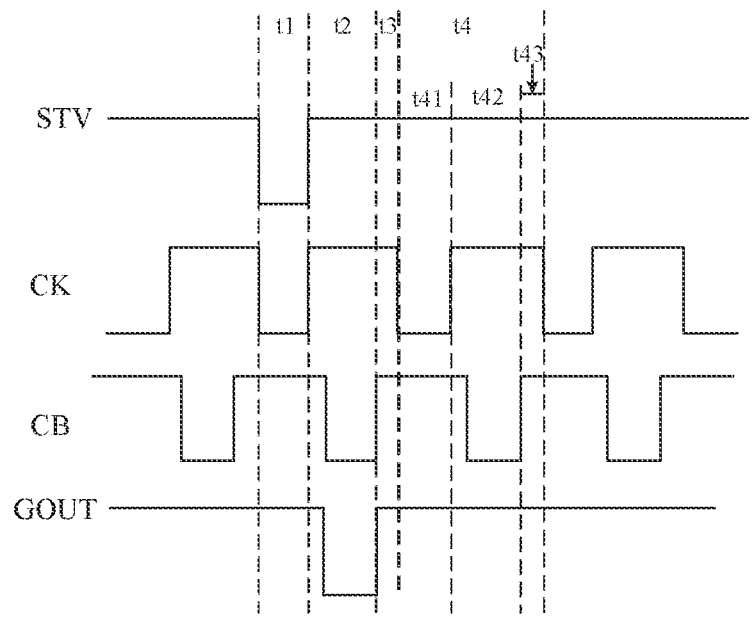
FIG. 2 is a timing diagram for driving a shift register unit of a display substrate provided by some embodiments of the present disclosure.

For example, as illustrated in FIG. 2, the working process of the shift register unit 100 provided by some embodiments of the present disclosure includes an input phase t1, an output phase t2, a buffer phase t3, and a stable phase t4.

For example, as illustrated in FIG. 1 and FIG. 2, in the input phase t1, the first clock signal provided on the first clock signal line CK is a low-level signal, the second clock signal provided on the second clock signal line CB is a high-level signal, and the input signal Vin provided on the input signal line STV is a low-level signal, for example, the input signal Vin being equal to the first power signal VL. Because the first clock signal is the low-level signal, the second transistor T2 is turned on, and the input signal is transmitted to the third node N3 through the second transistor T2. Because the second transistor T2 has threshold loss when transmitting the low-level signal, the voltage of the third node N3 is Vin−Vth2, that is, VL−Vth2, where Vth2 represents the threshold voltage of the second transistor T2. Because the gate electrode of the sixth transistor T6 receives the first power signal VL, the sixth transistor T6 is in the turn-on state, and thus, the voltage VL−Vth2 is transmitted to the first node N1 through the sixth transistor T6. For example, the threshold voltage of the sixth transistor T6 is represented as Vth6. Similarly, because the sixth transistor T6 has threshold loss when transmitting the low-level signal, the voltage of the first node N1 is VL−VthN1, where VthN1 is the smaller one of Vth2 and Vth6. The voltage of the first node N1 may control the eighth transistor T8 to be turned on, and the second clock signal is written to the output terminal GOUT through the eighth transistor T8 as the output signal, that is, in the input phase t1, the output signal is the high-level second clock signal, i.e., the second power signal VH.

For example, in the input phase t1, because the first clock signal is the low-level signal, the first transistor T1 is turned on, and the first power signal VL is transmitted to the second node N2 through the first transistor T1. Because the voltage of the third node N3 is VL−Vth2, the seventh transistor T7 is turned on, and the low-level first clock signal is transmitted to the second node N2 through the seventh transistor T7. For example, the threshold voltage of the seventh transistor T7 is represented as Vth7, and the threshold voltage of the first transistor T1 is represented as Vth1. In the case where Vth1<Vth7+Vth2, the voltage of the second node N2 is VL−Vth7−Vth2; and in the case where Vth1>Vth7+Vth2, the voltage of the second node N2 is VL−Vth1. In this phase, both the third transistor T3 and the fourth transistor T4 are turned on. Because the second clock signal is the high-level signal, the fifth transistor T5 is turned off.

For example, with reference to FIG. 1 and FIG. 2, in the output phase t2, the first clock signal provided on the first clock signal line CK is a high-level signal, the second clock signal provided on the second clock signal line CB is a low-level signal, and the input signal Vin provided on the input signal line STV is a high-level signal. The eighth transistor T8 is turned on, and the second clock signal is written to the output terminal GOUT through the eighth transistor T8 as the output signal. In the input phase t1, the voltage of one electrode, connected to the output terminal GOUT, of the second capacitor C2 is the second power signal VH, and the voltage of another electrode, connected to the first node N1, of the second capacitor C2 is VL−VthN1. In the output phase t2, the voltage of the electrode, connected to the output terminal GOUT, of the second capacitor C2 changes to VL, and because of the bootstrap effect of the second capacitor C2, the voltage of the another electrode, connected to the first node N1, of the second capacitor C2 changes to 2VL−VthN1−VH, that is, the voltage of the first node N1 becomes 2VL−VthN1−VH. In this phase, the sixth transistor T6 is turned off, the eighth transistor T8 may be better turned on, and the output signal is the first power signal VL.

For example, in the output phase t2, the first clock signal is the high-level signal, so that both the second transistor T2 and the first transistor T1 are turned off. The voltage of the third node N3 is still VL−VthN1, the seventh transistor T7 is turned on, and the high-level first clock signal is transmitted to the second node N2 through the seventh transistor T7, that is, the voltage of the second node N2 is the second power signal VH, so that both the third transistor T3 and the fourth transistor T4 are turned off. Because the second clock signal is the low-level signal, the fifth transistor T5 is turned on.

For example, with reference to FIG. 1 and FIG. 2, in the buffer phase t3, the first clock signal provided on the first clock signal line CK and the second clock signal provided on the second clock signal line CB are both high-level signals, and the input signal Vin provided on the input signal line STV is a high-level signal. The eighth transistor T8 is turned on, and the second clock signal is written to the output terminal GOUT through the eighth transistor T8 as the output signal. In this phase, the output signal is the high-level second clock signal, that is, the second power signal VH. Because of the bootstrap effect of the second capacitor C2, the voltage of the first node N1 becomes VL−VthN1.

For example, in the buffer phase t3, the first clock signal is the high-level signal, so that both the second transistor T2 and the first transistor T1 are turned off. The voltage of the first node N1 becomes VL−VthN1. In this phase, the sixth transistor T6 is turned on, the voltage of the third node N3 is also VL−VthN1, the seventh transistor T7 is turned on, and the high-level first clock signal is transmitted to the second node N2 through the seventh transistor T7, that is, the voltage of the second node N2 is the second power signal VH, so that both the third transistor T3 and the fourth transistor T4 are turned off. Because the second clock signal is the high-level signal, the fifth transistor T5 is turned off.

For example, with reference to FIG. 1 and FIG. 2, in a first sub-phase t41 of the stable phase t4, the first clock signal provided on the first clock signal line CK is a low-level signal, the second clock signal provided on the second clock signal line CB is a high-level signal, and the input signal Vin provided on the input signal line STV is a high-level signal, for example, the input signal Vin being equal to the second power signal VH. Because the first clock signal is the low-level signal, the second transistor T2 is turned on, and the input signal Vin is transmitted to the third node N3 through the second transistor T2. Because the second transistor T2 transmits the high-level signal without threshold loss, the voltage of the third node N3 is Vin (that is, the second power signal VH), and the seventh transistor T7 is turned off. Because the sixth transistor T6 is in the turn-on state, the voltage of the first node N1 is the same as the voltage of the third node N3, that is, the voltage of the first node N1 is VH, and the eighth transistor T8 is turned off. Because the first clock signal is the low-level signal, the first transistor T1 is turned on, the voltage of the second node N2 is VL−Vth1, the third transistor T3 and the fourth transistor T4 are both turned on, and the second power signal VH is transmitted to the output terminal GOUT through the third transistor T3, that is, the output signal is the second power signal VH.

For example, with reference to FIG. 1 and FIG. 2, in a second sub-phase t42 of the stable phase t4, the first clock signal provided on the first clock signal line CK is a high-level signal, the second clock signal provided on the second clock signal line CB is a low-level signal, and the input signal Vin provided on the input signal line STV is a high-level signal. Both the voltage of the first node N1 and the voltage of the third node N3 are Vin (that is, the second power signal VH), and both the eighth transistor T8 and the seventh transistor T7 are turned off. The first clock signal is the high-level signal, so that both the second transistor T2 and the first transistor T1 are turned off. Because of the maintaining effect of the first capacitor C1, the voltage of the second node N2 is still VL−Vth1, both the third transistor T3 and the fourth transistor T4 are turned on, the second power signal VH is transmitted to the output terminal GOUT through the third transistor T3, and the output signal is the second power signal VH.

For example, with reference to FIG. 1 and FIG. 2, in the second sub-phase t42, because the second clock signal is the low-level signal, the fifth transistor T5 is turned on, so that the second power signal VH is transmitted to the third node N3 and the first node N1 through the fourth transistor T4 and the fifth transistor T5, so as to allow the voltage of the first node N1 and the voltage of the third node N3 to be maintained at the high level.

For example, with reference to FIG. 1 and FIG. 2, in a third sub-phase t43 of the stable phase t4, the first clock signal provided on the first clock signal line CK and the second clock signal provided on the second clock signal line CB are both high-level signals, and the input signal Vin provided on the input signal line STV is a high-level signal. The voltage of the first node N1 and the voltage of the third node N3 are VH, and the eighth transistor T8 and the seventh transistor T7 are turned off. The first clock signal is the high-level signal, so that both the second transistor T2 and the first transistor T1 are turned off, the voltage of the second node N2 is still VL−Vth1, and the third transistor T3 and the fourth transistor T4 are both turned on. The second power signal VH is transmitted to the output terminal GOUT through the third transistor T3, and the output signal is the second power signal VH.

Hereinafter, a specific layout structure of a display substrate provided by some embodiments of the present disclosure is described by taking the circuit structure of the shift register unit 100 illustrated in FIG. 1 as an example.

For example, in some embodiments of the present disclosure, the display substrate includes: a semiconductor layer, a first insulating layer, a first conductive layer, a second insulating layer, a second conductive layer, a third insulating layer, and a third conductive layer.

For example, the semiconductor layer is located on the base substrate, and the first insulating layer is located on a side of the semiconductor layer away from the base substrate, that is, the semiconductor layer is located between the first insulating layer and the base substrate. The first conductive layer is located on a side of the first insulating layer away from the semiconductor layer, that is, the first insulating layer is located between the semiconductor layer and the first conductive layer. The second insulating layer is located on a side of the first conductive layer away from the first insulating layer, that is, the first conductive layer is located between the first insulating layer and the second insulating layer. The second conductive layer is located on a side of the second insulating layer away from the first conductive layer, that is, the second insulating layer is located between the first conductive layer and the second conductive layer. The third insulating layer is located on a side of the second conductive layer away from the second insulating layer, that is, the second conductive layer is located between the second insulating layer and the third insulating layer. The third conductive layer is located on a side of the third insulating layer away from the second conductive layer, that is, the third insulating layer is located between the second conductive layer and the third conductive layer.

Figure 3:
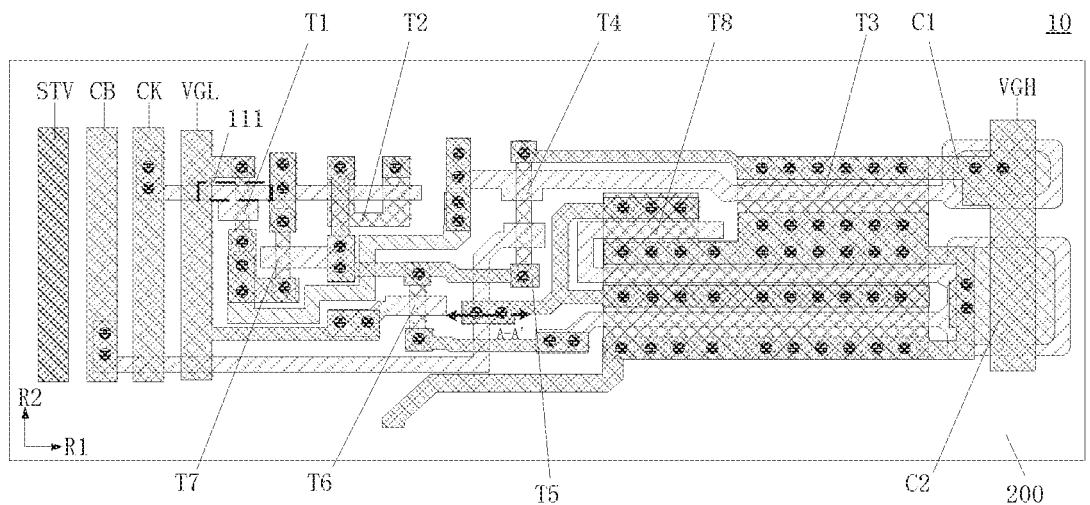
FIG. 3 is a layout diagram of a display substrate provided by some embodiments of the present disclosure.

FIG. 3 is a layout diagram of a display substrate provided by some embodiments of the present disclosure, and FIG. 4A to FIG. 4D are schematic planar diagrams of layers of the display substrate illustrated in FIG. 3.

For example, the display substrate 10 includes a base substrate 200 and the shift register unit 100 illustrated in FIG. 1, and the shift register unit 100 is provided on the base substrate 200.

For example, as illustrated in FIG. 3, the display substrate 10 includes transistors T1, T2, T3, T4, T5, T6, T7, and T8 illustrated in FIG. 1 and provided on the base substrate 200, includes the first power line VGL, the second power line VGH, the first clock signal line CK, the second clock signal line CB, and the input signal line STV, which are provided on the base substrate 200 and connected to the transistors T1, T2, T3, T4, T5, T6, T7, and T8, and further includes the first capacitor C1 and the second capacitor C2, which are provided on the base substrate 200.

Hereinafter, the specific layout structure of the display substrate 10 is described with reference to FIG. 3 and FIG. 4A to FIG. 4D.

Figure 4A:
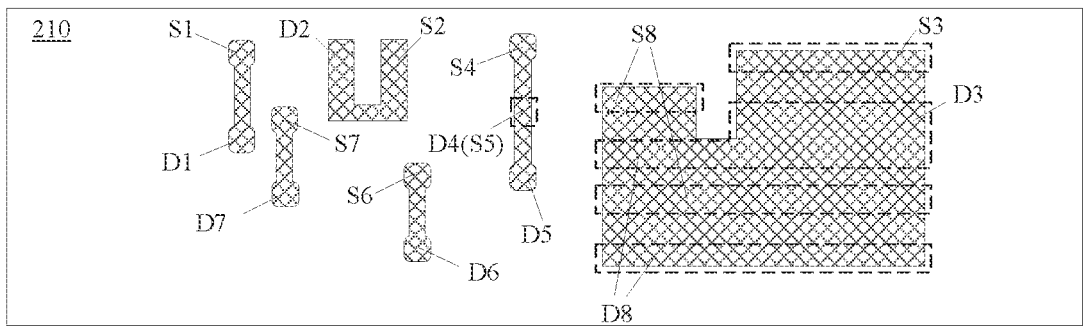
FIG. 4A to FIG. 4D are schematic planar diagrams of layers of the display substrate illustrated in FIG. 3.

For example, FIG. 4A illustrates the semiconductor layer 210 of the display substrate 10. For example, the semiconductor layer 210 may be patterned by using semiconductor materials. The semiconductor layer 210 may be used to manufacture active layers of the above transistors T1, T2, T3, T4, T5, T6, T7, and T8, and each active layer may include a source region, a drain region, and a channel region between the source region and the drain region. For example, the semiconductor layer 210 may be made of amorphous silicon, polycrystalline silicon, oxide semiconductor materials, etc. It should be noted that the above-mentioned source region and drain region may be regions doped with n-type impurities or p-type impurities.

For example, in the embodiments of the present disclosure, the doped source region corresponds to the source electrode of the transistor (e.g., the first electrode of the transistor), and the doped drain region corresponds to the drain electrode of the transistor (e.g., the second electrode of the transistor). For example, as illustrated in FIG. 4A, by taking the first transistor T1 as an example, the first electrode S1 of the first transistor T1 may correspond to the source region of the first transistor T1 in the semiconductor layer 210, and the second electrode D1 of the first transistor T1 may correspond to the drain region of the first transistor T1 in the semiconductor layer 210.

It should be noted that, in the embodiments of the present disclosure, the first electrode of the transistor includes the corresponding source region in the semiconductor layer 210, and the second electrode of the transistor includes the corresponding drain region in the semiconductor layer 210. However, this does not constitute a limitation on the embodiments of the present disclosure.

For example, in the display substrate 10 provided by the embodiments of the present disclosure, the channel of the transistor may correspond to, for example, the channel region between the source region and the drain region of the active layer of the transistor, the distance between the source region and the drain region is the length of the channel of the transistor, and the extending direction of the channel of the transistor is the direction from the first electrode to the second electrode of the transistor. For example, with reference to FIG. 3 and FIG. 4A, the extending direction of the channel of the first transistor T1 is the direction from the first electrode S1 to the second electrode D1, the extending direction of the channel of the fourth transistor T4 is the direction from the first electrode S4 to the second electrode D4, the extending direction of the channel of the fifth transistor T5 is the direction from the first electrode S5 to the second electrode D5, the extending direction of the channel of the sixth transistor T6 is the direction from the first electrode S6 to the second electrode D6, and the extending direction of the channel of the seventh transistor T7 is the direction from the first electrode S7 to the second electrode D7. The extending directions of the channel of the first transistor T1, the channel of the fourth transistor T4, the channel of the fifth transistor T5, the channel of the sixth transistor T6, and the channel of the seventh transistor T7 are all parallel to the extending direction of the first clock signal line CK and the extending direction of the second clock signal line CB. Therefore, the width of the position occupied by the shift register unit 100 in the display substrate 10 may be reduced, thereby reducing the width of the position occupied by the gate driving circuit including a plurality of cascaded shift register units 100 in the display substrate 10, so that the layout structure of the display substrate 10 is optimized, thereby reducing the frame size of the display device including the display substrate 10, so as to achieve the narrow frame design. In addition, the manufacturing cost of the display substrate 10 and the manufacturing cost of the display device including the display substrate 10 may also be reduced.

For example, as illustrated in FIG. 3 and FIG. 4A, the first electrode S1 and the second electrode D1 of the first transistor T1, the first electrode S2 and the second electrode D2 of the second transistor T2, the first electrode S3 and the second electrode D3 of the third transistor T3, the first electrode S4 and the second electrode D4 of the fourth transistor T4, the first electrode S5 and the second electrode D5 of the fifth transistor T5, the first electrode S6 and the second electrode D6 of the sixth transistor T6, the first electrode S7 and the second electrode D7 of the seventh transistor T7, and the first electrode S8 and the second electrode D8 of the eighth transistor T8 are provided in the semiconductor layer 210.

For example, the second electrode D4 of the fourth transistor T4 is electrically connected to the first electrode S5 of the fifth transistor T5, and for example, the second electrode D4 of the fourth transistor T4 and the first electrode S5 of the fifth transistor T5 may be integrally formed by using the same patterning process. The second electrode D3 of the third transistor T3 is electrically connected to the second electrode D8 of the eighth transistor T8, and for example, the second electrode D3 of the third transistor T3 and the second electrode D8 of the eighth transistor T8 may be integrally formed by using the same patterning process. The embodiments of the present disclosure are not limited in this aspect.

For example, in the display substrate 10 provided by the embodiments of the present disclosure, the first insulating layer (not illustrated) is formed on the semiconductor layer 210 illustrated in FIG. 4A, and the first insulating layer is used to protect the semiconductor layer 210. For example, the material of the first insulating layer may include the organic insulating material (for example, acrylic resin), the inorganic insulating material (for example, silicon nitride (SiNx) or silicon oxide (SiOx)), or the like, and the embodiments of the present disclosure are not limited in this aspect.

Figure 4B:
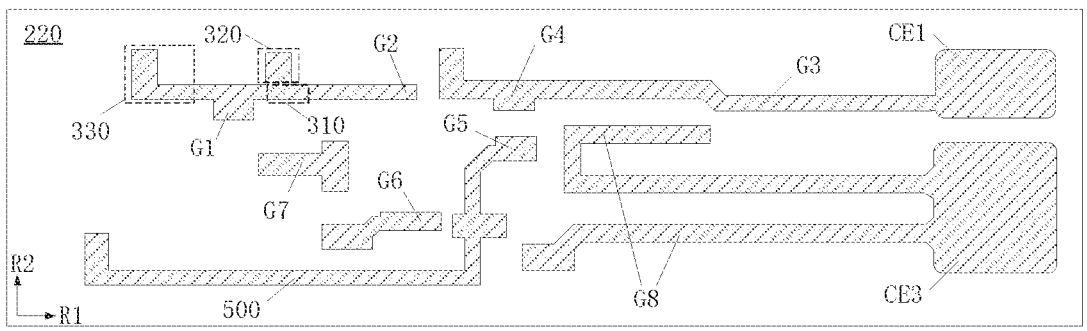

For example, FIG. 4B illustrates the first conductive layer 220 of the display substrate 10, and the first conductive layer 220 is provided on the first insulating layer so as to be insulated from the semiconductor layer 210. The first conductive layer 220 may include the first electrode CE1 of the first capacitor C1, the first electrode CE3 of the second capacitor C2, the gate electrode G1 of the first transistor T1, the gate electrode G2 of the second transistor T2, the gate electrode G3 of the third transistor T3, the gate electrode G4 of the fourth transistor T4, the gate electrode G5 of the fifth transistor T5, the gate electrode G6 of the sixth transistor T6, the gate electrode G7 of the seventh transistor T7, and the gate electrode G8 of the eighth transistor T8.

For example, in the first conductive layer 220, gate electrodes, electrically connected to the same signal line, of different transistors may be electrically connected to each other. For example, the gate electrode G1 of the first transistor T1 and the gate electrode G2 of the second transistor T2 are both electrically connected to the first clock signal line CK to receive the first clock signal, and therefore, in the first conductive layer 220, the gate electrode G1 of the first transistor T1 may be electrically connected to the gate electrode G2 of the second transistor T2.

For example, in some embodiments of the present disclosure, the control terminal of the input control circuit 110 includes a main body portion, and the extending direction of the main body portion is in a straight line. The extending direction of the main body portion is the first direction R1 illustrated in FIG. 3.

For example, with reference to FIG. 3 and FIG. 4B, the gate electrode G1 (that is, the control terminal of the input control circuit 110) of the first transistor T1 includes a first gate portion 111 (that is, the main body portion of the control terminal of the input control circuit 110), and the extending direction of the first gate portion 111 is in a straight line. Thus, the linear design of the first gate portion 111 may optimize the layout structure of the display substrate 10, and the pattern of the gate electrode G1 of the first transistor T1 formed during exposure is more similar to the designed pattern. Therefore, the influence of process fluctuations on the display substrate 10 during the manufacturing process may be reduced, for example, to avoid different lengths of gate electrodes G1 of first transistors T1 in different display substrates caused by the process fluctuations, thereby improving the stability of the prepared display substrate 10 and enabling the display substrate 10 to be in mass production and application.

For example, in some examples, as illustrated in FIG. 3, the shape of the orthographic projection of the first gate portion 111 on the base substrate 200 is approximately a rectangle, the orthographic projection of the first gate portion 111 on the base substrate 200 has adjacent first side and second side (e.g., the first side is perpendicular to the second side), the first side is parallel to the first direction R1, and the second side is parallel to the second direction R2.

For example, the extending direction of the first gate portion 111 is the first direction R1. In the second direction R2 perpendicular to the first direction R1, a distance between the orthographic projection of the first gate portion 111 on the base substrate 200 and the orthographic projection of the first electrode S1 of the first transistor T1 on the base substrate 200 is a certain value. In the second direction R2 perpendicular to the first direction R1, a distance between the orthographic projection of the first gate portion 111 on the base substrate 200 and the orthographic projection of the second electrode D1 of the first transistor T1 on the base substrate 200 is a certain value.

For example, in the second direction R2, the orthographic projection of the first gate portion 111 on the base substrate 200 is located between the orthographic projection of the first electrode S1 of the first transistor T1 on the base substrate 200 and the orthographic projection of the second electrode D1 of the first transistor T1 on the base substrate 200.

For example, the shape of the orthographic projection of the first electrode S1 of the first transistor T1 on the base substrate 200 is also approximately a rectangle, and the shape of the orthographic projection of the second electrode D1 of the first transistor T1 on the base substrate 200 is also approximately a rectangle. In the embodiments of the present disclosure, "a distance between the orthographic projection of the first gate portion 111 on the base substrate 200 and the orthographic projection of the first electrode S1 of the first transistor T1 on the base substrate 200" may be expressed as the distance between the first side of the orthographic projection of the first gate portion 111 on the base substrate 200 and the side, which is parallel to the first direction R1, of the orthographic projection of the first electrode S1 of the first transistor T1 on the base substrate 200. Similarly, "a distance between the orthographic projection of the first gate portion 111 on the base substrate 200 and the orthographic projection of the second electrode D1 of the first transistor T1 on the base substrate 200" may be expressed as the distance between the first side of the orthographic projection of the first gate portion 111 on the base substrate 200 and the side, which is parallel to the first direction R1, of the orthographic projection of the second electrode D1 of the first transistor T1 on the base substrate 200.

It should be noted that, in the embodiments of the present disclosure, the extending direction of the element is the extending direction of the geometric center line of the pattern outline of the element. For example, the extending direction of the first gate portion 111 is the extending direction of the geometric center line of the pattern outline of the first gate portion 111, that is, the extending direction is, for example, the direction from the first end of the first gate portion 111 to the second end of the first gate portion 111, i.e., the direction from the gate electrode G1 of the first transistor T1 to the gate electrode G2 of the second transistor T2.

For example, the shift register unit 100 of the display substrate 10 further includes a first wiring portion 310, and the first gate portion 111 of the gate electrode G1 of the first transistor T1 is directly connected to the first end of the first wiring portion 310.

For example, in some embodiments of the present disclosure illustrated in FIG. 3 and FIG. 4B, the first wiring portion 310 extends in a straight line along the first direction R1, that is, the extending direction of the first wiring portion 310 is the same as the extending direction of the first gate portion 111. The linear design of the first wiring portion 310 and the linear design of the first gate portion 111 of the gate electrode G1 of the first transistor T1 may further optimize the layout structure of the display substrate 10 and reduce the influence of process fluctuations on the display substrate 10 during the manufacturing process, thereby improving the stability of the prepared display substrate 10 and enabling the display substrate 10 to be in mass production and application.

For example, during the manufacturing process of the display substrate 10, the first gate portion 111 of the gate electrode G1 of the first transistor T1 and the first wiring portion 310 may be provided integrally, and for example, may be formed by the same patterning process, thereby optimizing the manufacturing process of the display substrate 10 and improving the stability of the manufacturing process of the display substrate 10.

For example, the gate electrode G2 (i.e., the control terminal of the input circuit 120) of the second transistor T2 is directly connected to the second end of the first wiring portion 310, and the extending direction of the gate electrode G2 of the second transistor T2 is in a straight line. For example, in some examples, the orthographic projection of the gate electrode G2 of the second transistor T2 on the base substrate 200 may also be approximately rectangular.

For example, in the first direction R1, the orthographic projection of the first wiring portion 310 on the base substrate 200 is located between the orthographic projection of the gate electrode G1 of the first transistor T1 on the base substrate 200 and the orthographic projection of the gate electrode G2 of the second transistor T2 on the base substrate 200, that is, in the first conductive layer 220, the first wiring portion 310 is located between the gate electrode G1 of the first transistor T1 and the gate electrode G2 of the second transistor T2 in the first direction R1.

For example, in some embodiments of the present disclosure illustrated in FIG. 3 and FIG. 4B, the extending direction of the gate electrode G2 of the second transistor T2 may be the first direction R1, that is, may be the same as the extending direction of the first gate portion 111 of the gate electrode G1 of the first transistor T1. The gate electrode G2 of the second transistor T2 and the gate electrode G1 of the first transistor T1 are arranged in the first direction R1, so that the first gate portion 111 of the gate electrode G1 of the first transistor T1, the first wiring portion 310, and the gate electrode G2 of the second transistor T2 may extend linearly along the first direction R1 as a whole. Thus, the linear design of the first gate portion 111 of the gate electrode G1 of the first transistor T1, the first wiring portion 310, and the gate electrode G2 of the second transistor T2 may further optimize the layout structure of the display substrate 10, and the entire pattern of the first gate portion 111 of the gate electrode G1 of the first transistor T1, the first wiring portion 310, and the gate electrode G2 of the second transistor T2 formed during exposure is closer to the designed pattern. Therefore, the influence of process fluctuations on the display substrate 10 during the manufacturing process can be reduced, for example, to avoid different lengths of first gate portions 111 of gate electrodes G1 of first transistors T1 and different lengths of gate electrodes G2 of second transistors T2 in different display substrates caused by the process fluctuations, thereby improving the stability of the prepared display substrate 10 and enabling the display substrate 10 to be in mass production and application.

For example, in the manufacturing process of the display substrate 10, the first gate portion 111 of the gate electrode G1 of the first transistor T1, the gate electrode G2 of the second transistor T2, and the first wiring portion 310 may be provided integrally, and for example, may be formed by the same patterning process, thereby optimizing the manufacturing process of the display substrate 10 and improving the stability of the manufacturing process of the display substrate 10.

For example, in some embodiments of the present disclosure, the shape of the orthographic projection of the first gate portion 111 of the gate electrode G1 of the first transistor T1, the gate electrode G2 of the second transistor T2, and the first wiring portion 310, which are integrally provided, on the base substrate 200 may be approximately rectangular.

For example, in some embodiments of the present disclosure, the first gate portion 111 of the gate electrode G1 of the first transistor T1 may also be directly connected (e.g., in direct contact) to the gate electrode G2 of the second transistor T2, that is, the first wiring portion 310 may not be required to be provided in the layout structure of the display substrate 10. The embodiments of the present disclosure are not limited in this aspect.

For example, the control terminal of the input control circuit 110 further includes a protruding portion, and the protruding portion is electrically connected to the main body portion. The gate electrode G1 of the first transistor T1 further includes a second gate portion, and the second gate portion is the protruding portion of the control terminal of the input control circuit 110. In the second direction R2, at least part of the orthographic projection of the second gate portion on the base substrate 200 is located between the orthographic projection of the first electrode S1 of the first transistor T1 on the base substrate 200 and the orthographic projection of the second electrode D1 of the first transistor T1 on the base substrate 200.

For example, the second gate portion of the gate electrode G1 of the first transistor T1 may be perpendicular to the first gate portion 111 of the gate electrode G1 of the first transistor T1, so as to reduce the influence of process fluctuations on the layout structure of the display substrate 10 during the manufacturing process, thereby improving the stability of the prepared display substrate 10. For example, the shape of the orthographic projection of the gate electrode G1 of the first transistor T1 on the base substrate 200 (i.e., the shape of the entire orthographic projection of the second gate portion of the gate electrode G1 of the first transistor T1 and the first gate portion 111 of the gate electrode G1 of the first transistor T1 on the base substrate 200) may be, for example, T-shaped, inverted T-shaped, L-shaped, cross-shaped, etc., and is not limited by the embodiments of the present disclosure.

For example, in some embodiments of the present disclosure, the first gate portion 111 of the gate electrode G1 of the first transistor T1 and the second gate portion of the gate electrode G1 of the first transistor T1 may be provided integrally, and for example, may be formed by the same patterning process, thereby optimizing the manufacturing process of the display substrate 10 and improving the stability of the manufacturing process of the display substrate 10.

For example, the second gate portion of the gate electrode G1 of the first transistor T1 may be a portion protruding from the side, corresponding to the first side of the orthographic projection of the first gate portion 111 on the base substrate 200, of the first gate portion 111 in the second direction R2.

For example, in some examples, the shape of the orthographic projection of the second gate portion of the gate electrode G1 of the first transistor T1 on the base substrate 200 may also be approximately rectangular. For example, with reference to FIG. 3 and FIG. 4B, the shift register unit 100 of the display substrate 10 further includes a second wiring portion 320 and a third wiring portion 330, and the first wiring portion 310, the second wiring portion 320, and the third wiring portion 330 are electrically connected to each other. For example, as illustrated in FIG. 4B, the third wiring portion 330 is not directly connected to the first wiring portion 310 and the second wiring portion 320.

For example, the second wiring portion 320 extends along the second direction R2, and the third wiring portion 330 extends along the first direction R1.

For example, the shape of the orthographic projection of the entirety of the second wiring portion 320 and the first wiring portion 310 on the base substrate 200 may be T-shaped, inverted T-shaped, L-shaped, cross-shaped, etc. The shape of the orthographic projection of the third wiring portion 330 on the base substrate 200 may be rectangular, L-shaped, cross-shaped, etc.

In some embodiments of the present disclosure, the first electrode S7 of the seventh transistor T7 may be electrically connected to the second wiring portion 320 through a plurality of via holes, so as to be electrically connected to the first wiring portion 310, thereby optimizing the connection relationship in the display substrate 10 and reducing the contact resistance.

For example, the second wiring portion 320 may be used to electrically connect the gate electrode G1 of the first transistor T1 and the gate electrode G2 of the second transistor T2 with, for example, the first electrode of the seventh transistor T7. For example, a connection component may be provided in other layers of the display substrate 10, and via holes may be designed at positions, corresponding to the second wiring portion 320 and the first electrode of the seventh transistor T7, respectively, of the connection component, so that the first electrode of the seventh transistor T7 may be electrically connected to the second wiring portion 320 and further electrically connected to the first clock signal line CK, thereby receiving the first clock signal (the specific setting method of the connection component is described later).

For example, in the manufacturing process of the display substrate 10, the second wiring portion 320 and the first wiring portion 310 may be integrally provided, and for example, may be formed by the same patterning process. That is, the gate electrode G1 (including the first gate portion 111 and the second gate portion) of the first transistor T1, the gate electrode G2 of the second transistor T2, the first wiring portion 310, and the second wiring portion 320 may be integrally formed, thereby further optimizing the manufacturing process of the display substrate 10 and improving the stability of the manufacturing process of the display substrate 10.

For example, the third wiring portion 330 is configured to transmit the first clock signal provided by the first clock signal line CK to the gate electrode G1 of the first transistor T1. The third wiring portion 330 extends in the first direction R1, the first end of the third wiring portion 330 is electrically connected to the first clock signal line CK, and the second end of the third wiring portion 330 is electrically connected to the gate electrode G1 of the first transistor T1, so that the first clock signal may be transmitted to the gate electrode G1 of the first transistor T1 and further transmitted to the gate electrode G2 of the second transistor T2.

For example, the third wiring portion 330 and the gate electrode G1 of the first transistor T1 may be provided integrally, and for example, may be formed by the same patterning process. That is, the gate electrode G1 (including the first gate portion 111 and the second gate portion) of the first transistor T1, the gate electrode G2 of the second transistor T2, the first wiring portion 310, the second wiring portion 320, and the third wiring portion 330 may be formed integrally, thereby further optimizing the manufacturing process of the display substrate 10 and improving the stability of the manufacturing process of the display substrate 10.

For example, the first clock signal line CK is located in the third conductive layer 240 illustrated in FIG. 4D, and the first end of the third wiring portion 330 may be electrically connected to the first clock signal line CK through the tenth via hole H10 illustrated in FIG. 4D described below.

For example, in the first conductive layer 220, the first electrode CE1 of the first capacitor C1, the gate electrode G3 of the third transistor T3, and the gate electrode G4 of the fourth transistor T4 may be electrically connected to each other, and for example, may be formed by the same patterning process. The first electrode CE3 of the second capacitor C2 and the gate electrode G8 of the eighth transistor T8 may be electrically connected to each other, and for example, may be formed by the same patterning process. The embodiments of the present disclosure are not limited in this aspect.

For example, in the display substrate 10 provided by the embodiments of the present disclosure, the second insulating layer (not illustrated) is formed on the first conductive layer 220 illustrated in FIG. 4B, and the second insulating layer is used to protect the first conductive layer 220. For example, the material of the second insulating layer may include the organic insulating material (for example, acrylic resin), the inorganic insulating material (for example, silicon nitride (SiNx) or silicon oxide (SiOx)), or the like, and the embodiments of the present disclosure are not limited in this aspect.

Figure 4C:
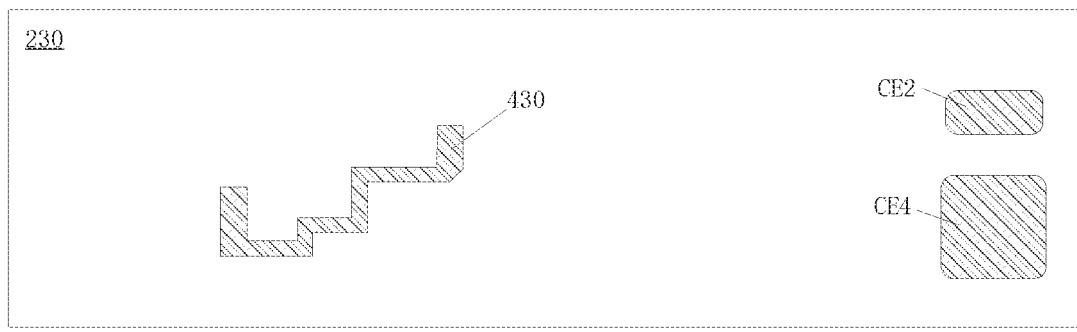

For example, FIG. 4C illustrates the second conductive layer 230 of the display substrate 10, and the second conductive layer 230 is provided on the second insulating layer so as to be insulated from the first conductive layer 220. The second conductive layer 230 may include the second electrode CE2 of the first capacitor C1, the second electrode CE4 of the second capacitor C2, and the third connection component 430.

For example, the second electrode CE2 of the first capacitor C1 at least partially overlaps with the first electrode CE1 of the first capacitor C1 located in the first conductive layer 220, so as to form the first capacitor C1, that is, the orthographic projection of the second electrode CE2 of the first capacitor C1 on the base substrate 200 at least partially overlaps with the orthographic projection of the first electrode CE1 of the first capacitor C1 on the base substrate 200. The second electrode CE4 of the second capacitor C2 at least partially overlaps with the first electrode CE3 of the second capacitor C2 located in the first conductive layer 220, so as to form the second capacitor C2, that is, the orthographic projection of the second electrode CE4 of the second capacitor C2 on the base substrate 200 at least partially overlaps with the orthographic projection of the first electrode CE3 of the second capacitor C2 on the base substrate 200.

For example, the third connection component 430 may be used to electrically connect the gate electrode G4 of the fourth transistor T4, the second electrode D7 of the seventh transistor T7, and the second electrode D1 of the first transistor T1. The connection manner of the third connection component 430 is described in detail later, and details are not described herein again.

For example, in the display substrate 10 provided by the embodiments of the present disclosure, the third insulating layer (not illustrated) is formed on the second conductive layer 230 illustrated in FIG. 4C, and the third insulating layer is used to protect the second conductive layer 230. For example, the material of the third insulating layer may include the organic insulating material (for example, acrylic resin), the inorganic insulating material (for example, silicon nitride (SiNx) or silicon oxide (SiOx)), or the like, and the embodiments of the present disclosure are not limited in this aspect.

Figure 4D:
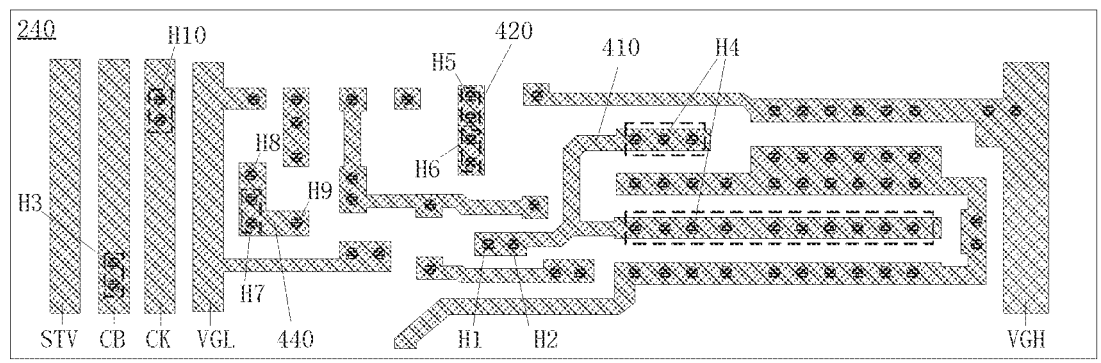

For example, FIG. 4D illustrates the third conductive layer 240 of the display substrate 10, and the third conductive layer 240 is provided on the third insulating layer so as to be insulated from the second conductive layer 230. The third conductive layer 240 may include the first clock signal line CK, the second clock signal line CB, the first power line VGL, the second power line VGH, the input signal line STV, and a plurality of connection components. For example, the plurality of connection components may be used to correspondingly electrically connect gate electrodes of the transistors with the first electrodes or second electrodes (such as source regions or drain regions) of the transistors in different layers in the display substrate 10 through via holes.

It should be noted that in the embodiments of the present disclosure, the first electrode of the transistor further includes a portion, corresponding to the source region in the semiconductor layer 210, in the third conductive layer 240, and the second electrode of the transistor further includes a portion, corresponding to the drain region in the semiconductor layer 210, in the third conductive layer 240, but this is not limitative of the embodiments of the present disclosure.

For example, the first clock signal line CK, the second clock signal line CB, the first power line VGL, the second power line VGH, and the input signal line STV all extend in the second direction R2.

For example, the first connection component 410 is provided in the third conductive layer 240, and the first electrode S8 of the eighth transistor T8 is electrically connected to the gate electrode G5 of the fifth transistor T5 through the first connection component 410, so as to be electrically connected to the second clock signal line CB.

For example, as illustrated in FIG. 4A and FIG. 4D, the first electrode S8 of the eighth transistor T8 is located in the semiconductor layer 210, and the first electrode S8 of the eighth transistor T8 is electrically connected to the first connection component 410 through a plurality of fourth via holes H4. The plurality of fourth via holes H4 are located in the first insulating layer, the second insulating layer, and the third insulating layer, and are through the first insulating layer, the second insulating layer, and the third insulating layer.

For example, the gate electrode G5 of the fifth transistor T5 is located in the first conductive layer 220, and the first connection component 410 is electrically connected to the gate electrode G5 of the fifth transistor T5 through two first via holes H1 and H2. The first via holes H1 and H2 are located in the second insulating layer and the third insulating layer, and are through the second insulating layer and the third insulating layer.

Figure 5:
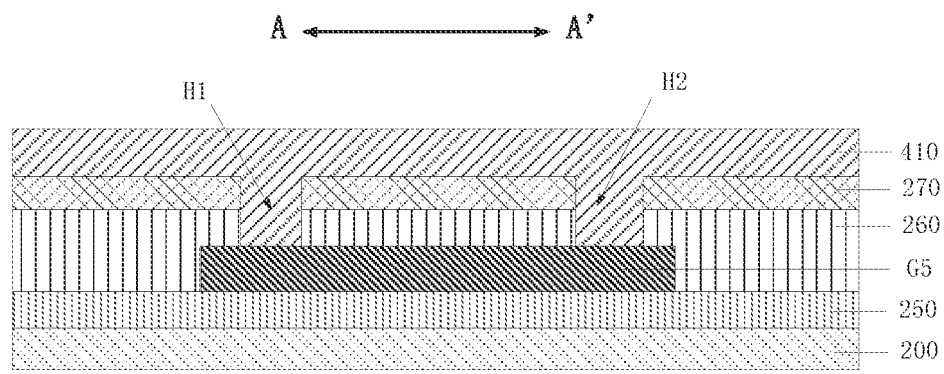
FIG. 5 is a schematic diagram of a cross-sectional structure of the display substrate illustrated in FIG. 3 along a line A-A'.

FIG. 5 is a schematic diagram of a cross-sectional structure of the display substrate illustrated in FIG. 3 along a line A-A'. For example, as illustrated in FIG. 5, the first via holes H1 and H2 are located in the second insulating layer 260 and the third insulating layer 270, and are through the second insulating layer 260 and the third insulating layer 270, so that the first connection component 410 located in the third conductive layer 240 is electrically connected to the gate electrode G5 of the fifth transistor T5 located in the first conductive layer 220.

For example, the gate electrode G5 of the fifth transistor T5 may be located on the first insulating layer 250.

For example, in the first direction R1, the orthographic projections of the first via holes H1 and H2 on the base substrate 200 are located on a side, away from the orthographic projection of the gate electrode G8 of the eighth transistor T8 on the base substrate 200, of the orthographic projection of the gate electrode G5 of the fifth transistor T5 on the base substrate 200. That is, in the direction perpendicular to the base substrate 200, the first via holes H1 and H2 may be provided on a side of the gate electrode G5 of the fifth transistor T5 away from the gate electrode G8 of the eighth transistor T8. Therefore, the arrangement of positions of the first via holes H1 and H2 may reduce the width of the position occupied by the shift register unit 100 in the display substrate 10 in the first direction R1, and may optimize the layout structure of the display substrate 10, thereby reducing the frame size of the display device including the display substrate 10 to achieve the narrow frame design, and further reducing the manufacturing cost of the display substrate 10 and the manufacturing cost of the display device including the display substrate 10.

For example, as illustrated in FIG. 4D, according to the layout structure of the display substrate 10, the two first via holes H1 and H2 may be arranged in the first direction R1. Alternatively, in some other embodiments of the present disclosure, according to different actual needs, the two first via holes H1 and H2 may also be arranged in the second direction R2 or other directions, which is not limited by the embodiments of the present disclosure.

For example, in some other embodiments of the present disclosure, only one first via hole H1 or one first via hole H2 may be provided, that is, the first connection component 410 may be electrically connected to the gate electrode G5 of the fifth transistor T5 through only one first via hole H1 or one first via hole H2. Alternatively, three or more first via holes H1 (or first via holes H2) may be provided, that is, the first connection component 410 may also be electrically connected to the gate electrode G5 of the fifth transistor T5 through more than two first via holes H1 (or first via holes H2), which is not limited by the embodiments of the present disclosure.

For example, as illustrated in FIG. 3, FIG. 4B, and FIG. 4D, the second clock signal line CB is located in the third conductive layer 240, and the gate electrode G5 of the fifth transistor T5 is electrically connected to the second clock signal line CB through the fourth wiring portion 500 located in the first conductive layer 220. For example, the gate electrode G5 of the fifth transistor T5 is electrically connected to the fourth wiring portion 500 in the first conductive layer 220, the fourth wiring portion 500 is electrically connected to the second clock signal line CB through the third via hole H3, and the third via hole H3 is located in the second insulating layer and the third insulating layer, and penetrates the second insulating layer and the third insulating layer.

For example, in some embodiments of the present disclosure, the fourth wiring portion 500 and the gate electrode G5 of the fifth transistor T5 may be provided integrally, and for example, may be formed by the same patterning process, which is not limited by the embodiments of the present disclosure.

For example, the second connection component 420 and the fourth connection component 440 are provided in the third conductive layer 240, and the gate electrode G4 of the fourth transistor T4 is electrically connected to the second electrode D1 of the first transistor T1 and the second electrode D7 of the seventh transistor T7 through the second connection component 420, the fourth connection component 440, and the third connection component 430 located in the second conductive layer 230.

For example, as illustrated in FIG. 4D, in some examples, the shape of the second connection component 420 may be rectangular, and the shape of the fourth connection component 440 may be L-shaped.

For example, the gate electrode G4 of the fourth transistor T4 is located in the first conductive layer 220, and the gate electrode G4 of the fourth transistor T4 is electrically connected to the second connection component 420 through the fifth via hole H5. The fifth via hole H5 is located in the second insulating layer and the third insulating layer, and penetrates the second insulating layer and the third insulating layer.

For example, in the embodiments of the present disclosure illustrated in FIG. 3 and FIG. 4D, the gate electrode G4 of the fourth transistor T4 is electrically connected to the second connection component 420 through two fifth via holes H5 arranged in the second direction R2. However, in some other embodiments of the present disclosure, only one fifth via hole H5 may be provided; or, a plurality of (e.g., three, four, or the like) fifth via holes H5 may be provided, and the plurality of fifth via holes H5 may be arranged in the first direction R1, the second direction R2, or other directions according to different actual layout requirements, which is not limited by the embodiments of the present disclosure.

For example, the second connection component 420 is electrically connected to the third connection component 430 through the sixth via hole H6, and the sixth via hole H6 is located in the third insulating layer and is through the third insulating layer.

For example, in the embodiments of the present disclosure as illustrated in FIG. 3 and FIG. 4D, the second connection component 420 is electrically connected to the third connection component 430 through two sixth via holes H6 arranged in the second direction R2. However, in some other embodiments of the present disclosure, only one sixth via hole H6 may be provided; or, a plurality of (e.g., three, four, or the like) sixth via holes H6 may be provided, and the plurality of sixth via holes H6 may be arranged in the first direction R1, the second direction R2, or other directions according to different actual layout requirements, which is not limited by the embodiments of the present disclosure.

For example, in the embodiments illustrated in FIG. 3 and FIG. 4D, the arrangement of the fifth via hole H5 and the sixth via hole H6 in the second direction R2 may reduce the width of the position occupied by the shift register unit 100 in the display substrate 10 in the first direction R1, and may optimize the layout structure of the display substrate 10, thereby reducing the frame size of the display device including the display substrate 10 to achieve the narrow frame design.

For example, as illustrated in FIG. 4C and FIG. 4D, the third connection component 430 is electrically connected to the fourth connection component 440 through the seventh via hole H7, and the seventh via hole H7 is located in the third insulating layer and is through the third insulating layer.

For example, in the embodiments of the present disclosure, the third connection component 430 is electrically connected to the fourth connection component 440 through two seventh via holes H7 arranged in the second direction R2. However, in some other embodiments of the present disclosure, only one seventh via hole H7 may be provided; or, a plurality of (e.g., three, four, or the like) seventh via holes H7 may be provided, and the plurality of seventh via holes H7 may be arranged in the first direction R1, the second direction R2, or other directions according to different actual layout requirements, which is not limited by the embodiments of the present disclosure.

It should be noted that, in some embodiments, the number of fifth via holes H5, the number of sixth via holes H6, and the number of seventh vi holes H7 may be the same, and may all be one. Alternatively, the number of fifth via holes H5, the number of sixth via holes H6, and the number of seventh via holes H7 may all be more than one (for example, two, three, or the like). In some other embodiments, at least part of a group consisting of the number of fifth via holes H5, the number of sixth via holes H6, and the number of seventh via holes H7 may be the same. For example, the number of seventh via holes H7 may be two, and both the number of fifth via holes H5 and the number of sixth via holes H6 may be one. The embodiments of the present disclosure are not limited in this aspect.

For example, as illustrated in FIG. 3 or FIG. 4C, the third connection component 430 may be of a polyline type, and for example, at least one bending portion of the third connection component 430 may be set at a right angle, thereby reducing the influence of process fluctuations on the display substrate 10 during the manufacturing process, optimizing the manufacturing process of the display substrate 10, and improving the stability of the prepared display substrate 10. Alternatively, in some other embodiments of the present disclosure, according to different actual layout requirements, the bending portion of the third connection component 430 may also be set to other angles, or the third connection component 430 may also be set to other suitable shapes, which is not limited by the embodiments of the present disclosure.

For example, as illustrated in FIG. 4A and FIG. 4D, the second electrode D1 of the first transistor T1 and the second electrode D7 of the seventh transistor T7 are located in the semiconductor layer 210, the second electrode D1 of the first transistor T1 is electrically connected to the fourth connection component 440 through the eighth via hole H8, and the second electrode D7 of the seventh transistor T7 is electrically connected to the fourth connection component 440 through the ninth via hole H9. The eighth via hole H8 and the ninth via hole H9 are located in the first insulating layer, the second insulating layer, and the third insulating layer, and penetrate the first insulating layer, the second insulating layer, and the third insulating layer.

For example, in some other embodiments of the present disclosure, a plurality of (e.g., two, three, or the like) eighth via holes H8 may be provided to allow the second electrode D1 of the first transistor T1 to be electrically connected to the fourth connection component 440, a plurality of (e.g., two, three, or the like) ninth via holes H9 may also be provided to allow the second electrode D7 of the seventh transistor T7 to be electrically connected to the fourth connection component 440, and the embodiments of the present disclosure are not limited in this aspect.

For example, the seventh via hole H7 and the eighth via hole H8 are arranged in the second direction R2.

For example, with reference to FIG. 4A and FIG. 4D, the first clock signal line CK is located in the third conductive layer 240, the gate electrode G1 of the first transistor T1, the gate electrode G2 of the second transistor T2, and the third wiring portion 330 are located in the first conductive layer 220, and the first end of the third wiring portion 330 is electrically connected to the first clock signal line CK through the tenth via hole H10. The tenth via hole H10 is located in the second insulating layer and the third insulating layer, and is through the second insulating layer and the third insulating layer.

For example, in the embodiments of the present disclosure, the first end of the third wiring portion 330 is electrically connected to the first clock signal line CK through two tenth via holes H10 arranged in the second direction R2. However, in some other embodiments of the present disclosure, only one tenth via hole H10 may be provided; or, a plurality of (e.g., three, four, or the like) tenth via holes H10 may be provided, and the plurality of tenth via holes H10 may be arranged in the first direction R1, the second direction R2, or other directions according to different actual layout requirements, which is not limited by the embodiments of the present disclosure.

For example, in the display substrate 10 provided by the embodiments of the present disclosure, the fourth insulating layer (not illustrated) is formed on the third conductive layer 240 illustrated in FIG. 4D, and the fourth insulating layer is used to protect the third conductive layer 240. For example, in the case where the display substrate 10 is an OLED substrate, for example, the anode of each pixel unit may be provided on the fourth insulating layer. For example, according to different actual requirements, other structures or functional layers of the display substrate 10 may also be formed on the third conductive layer 240, which is not limited by the embodiments of the present disclosure.

For example, in the display substrate 10 provided by the embodiments of the present disclosure, other structures or functional layers may also be included among the layers of the display substrate 10 illustrated in FIG. 4A to FIG. 4D described above, and the embodiments of the present disclosure are not limited in this aspect.

At least an embodiment of the present disclosure further provides a manufacturing method of the display substrate according to any one of the embodiments of the present disclosure, and the manufacturing method includes: forming a first conductive layer on the base substrate, the first conductive layer including the main body portion of the control terminal of the input control circuit.

For example, by taking the display substrate 10 illustrated in FIG. 3 as an example, as illustrated in FIG. 3 and FIG. 4A to FIG. 4D, the manufacturing method of the display substrate 10 provided by some embodiments of the present disclosure includes: forming the semiconductor layer 210 on the base substrate 200; forming the first insulating layer on the semiconductor layer 210; forming the first conductive layer 220 on the base substrate 200 on which the first insulating layer is formed, where the first conductive layer 220 includes the main body portion of the control terminal of the input control circuit 110, and the extending direction of the main body portion is in a straight line; forming the second insulating layer on the first conductive layer 220; forming the second conductive layer 230 on the second insulating layer; forming the third insulating layer on the second conductive layer 230; and forming the third conductive layer 240 on the third insulating layer.

For example, each of the first insulating layer, the second insulating layer, and the third insulating layer covers the entire surface of the base substrate 200.

For example, the manufacturing method of the display substrate 10 provided by some embodiments of the present disclosure may include more or fewer steps, and the sequence among the steps may be determined according to actual needs. The technical effects of the manufacturing method may be with reference to the above description of the display substrate 10, and details are not described herein again.

For example, in some embodiments of the present disclosure, the display substrate includes a gate driving circuit, and the gate driving circuit includes a plurality of cascaded shift register units described above.

Figure 6:
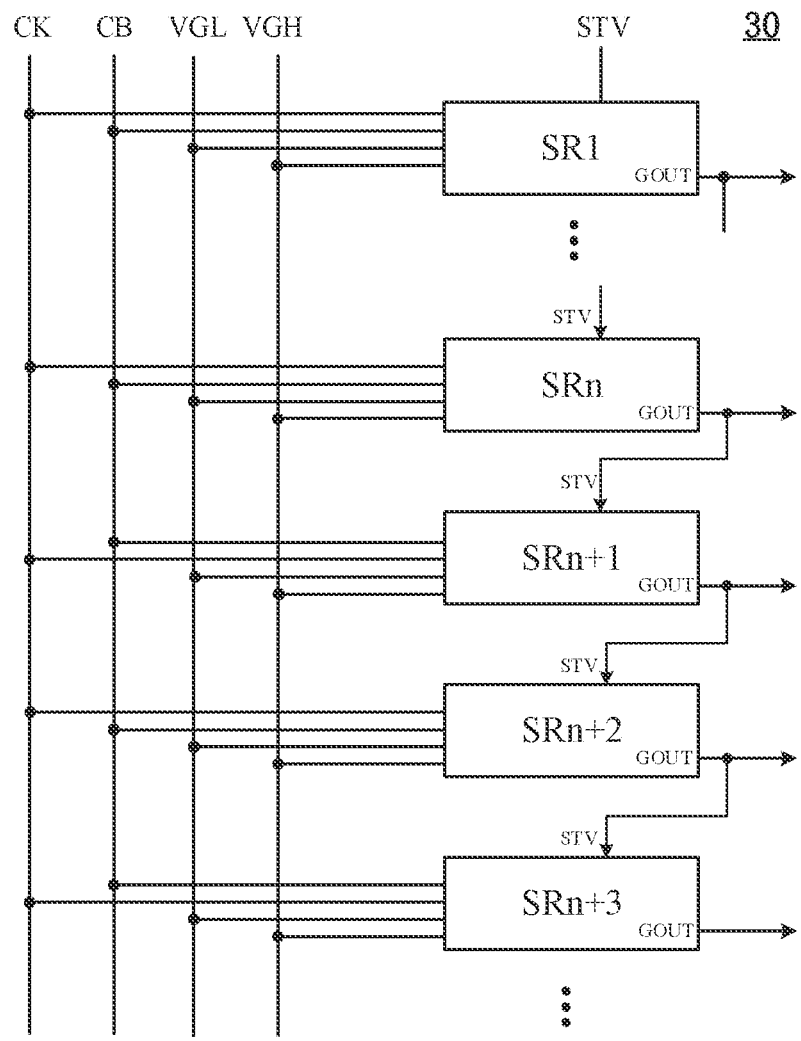
FIG. 6 is a schematic block diagram of a gate driving circuit of a display substrate provided by some embodiments of the present disclosure.

FIG. 6 is a schematic block diagram of a gate driving circuit of a display substrate provided by some embodiments of the present disclosure. For example, as illustrated in FIG. 6, the gate driving circuit 30 includes a plurality of cascaded shift register units (SR1, SRn, SRn+1, SRn+2, SRn+3, etc., n being an integer greater than 1), and each of the plurality of shift register units is, for example, the shift register unit 100 illustrated in FIG. 1. The number of the plurality of shift register units 100 is not limited, and may be determined according to actual needs.

For example, as illustrated in FIG. 6, each-stage shift register unit 100 is electrically connected to the first clock signal line CK, the second clock signal line CB, the first power line VGL, and the second power line VGH, respectively, to receive the corresponding first clock signal, the corresponding second clock signal, the corresponding first power signal, and the corresponding second power signal.

For example, in some embodiments of the present disclosure, the input signal line STV electrically connected to the first-stage shift register unit 100 (e.g., SR1) is a trigger signal line, that is, the first-stage shift register unit 100 (e.g., SR1) in the gate driving circuit 30 is connected to the trigger signal line to receive the trigger signal provided by the trigger signal line as the corresponding input signal STV. Each of the other shift register units 100 (such as SRn, SRn+1, SRn+2, SRn+3) except the first-stage shift register unit may be electrically connected to the output terminal GOUT of the previous-stage shift register unit 100 to use the output signal of the output terminal GOUT of the previous-stage shift register unit 100 as the input signal STV of the current-stage shift register unit 100, thereby optimizing the structure of the gate driving circuit 30 and reducing the frame size of the display substrate including the gate driving circuit 30 to achieve the narrow frame design.

For example, in some embodiments of the present disclosure, the electrical connection manner of two adjacent shift register units 100 with the first clock signal line CK and the second clock signal line CB may be adjusted accordingly. For example, by taking the circuit structure of the shift register unit 100 illustrated in FIG. 1 as an example, in the shift register unit SRn, the gate electrode of the first transistor T1, the gate electrode of the second transistor T2, and the first electrode of the seventh transistor T7 may be, for example, electrically connected to the first clock signal line CK, and the gate electrode of the fifth transistor T5 and the first electrode of the eighth transistor T8 may be electrically connected to the second clock signal line CB; and accordingly, in the shift register unit SRn+1, the gate electrode of the first transistor T1, the gate electrode of the second transistor T2, and the first electrode of the seventh transistor T7 may be electrically connected to the second clock signal line CB, and the gate electrode of the fifth transistor T5 and the first electrode of the eighth transistor T8 may be electrically connected to the first clock signal line CK. The embodiments of the present disclosure are not limited in this aspect.

For example, the gate driving circuit 30 may further include other corresponding signal lines electrically connected to the first-stage shift register unit 100, the last-stage shift register unit 100, or each-stage shift register unit 100, and the embodiments of the present disclosure are not limited in this aspect.

It should be noted that, in the embodiments of the present disclosure, the cascading method of the shift register units 100 in the gate driving circuit 30 is not limited, and may be the connection method illustrated in FIG. 6, or may be other suitable connection methods, and the embodiments of the present disclosure are not limited in this aspect.

For example, the gate driving circuit 30 may be provided on one side of the display substrate 10, or may be provided on both sides of the display substrate 10 to achieve bilateral driving, which is not limited by the embodiments of the present disclosure.

At least an embodiment of the present disclosure further provides a display device, and the display device includes the display substrate according to any one of the embodiments of the present disclosure.

Figure 7:
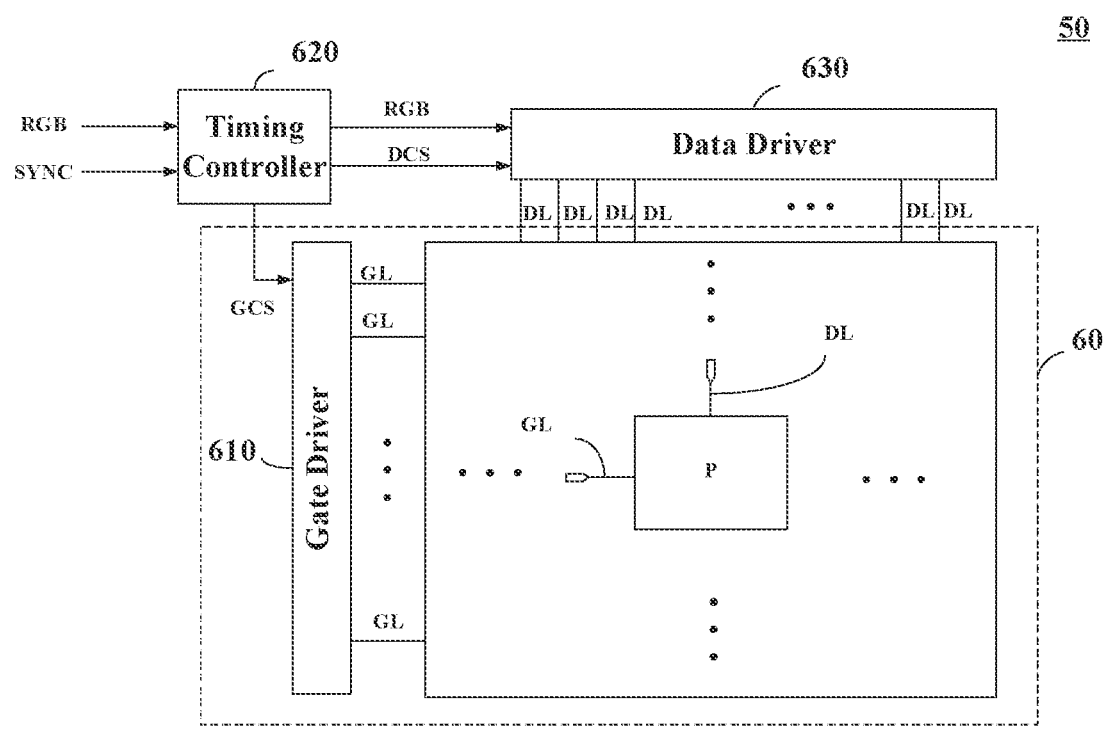
FIG. 7 is a schematic diagram of a display device provided by some embodiments of the present disclosure.

FIG. 7 is a schematic diagram of a display device provided by some embodiments of the present disclosure. For example, as illustrated in FIG. 7, the display device 50 includes a display substrate 60. The display substrate 60 may be the display substrate according to any one of the embodiments of the present disclosure, and for example, may be the display substrate 10 illustrated in FIG. 3.

For example, in an example illustrated in FIG. 7, the display substrate 60 includes a gate driver 610, for example, the gate driver 610 may include the gate driving circuit 30 illustrated in FIG. 6, and the gate driver 610 is provided in the peripheral region of the display substrate 60.

For example, as illustrated in FIG. 7, the display device 50 further includes a timing controller 620 and a data driver 630.

For example, the display device 50 includes a plurality of pixel units P defined by intersecting a plurality of gate lines GL with a plurality of data lines DL, and the plurality of pixel units P are provided in the pixel array region of the display substrate 60. The gate driver 610 is used to drive the plurality of gate lines GL, the data driver 630 is used to drive the plurality of data lines DL, and the timing controller 620 is used to process image data RGB input from outside of the display device 50, provide the processed image data RGB to the data driver 630, and output the scanning control signal GCS and the data control signal DCS to the gate driver 610 and the data driver 630, so as to control the gate driver 610 and the data driver 630.

For example, by taking the gate driver 610 including the gate driving circuit 30 illustrated in FIG. 6 as an example, the output terminals GOUT of the plurality of shift register units 100 in the gate driving circuit 30 are correspondingly connected to the plurality of gate lines GL. The plurality of gate lines GL are correspondingly connected to the pixel units P arranged in a plurality of rows. The output terminals GOUT of the shift register units 100 in the gate driving circuit 30 sequentially output signals to the plurality of gate lines GL, so as to allow the plurality of rows of pixel units P in the display device 50 to be progressively scanned. For example, the gate driver 610 may be implemented as a semiconductor chip, or may be integrated in the display device 50 to constitute a GOA circuit.

For example, the data driver 630 uses the reference gamma voltage to convert digital image data RGB input from the timing controller 620 into data signals according to a plurality of data control signals DCS from the timing controller 620. The data driver 630 provides converted data signals to the plurality of data lines DL. For example, the data driver 630 may be implemented as a semiconductor chip.

For example, the timing controller 620 processes the externally input image data RGB to match the size and resolution of the display device 50, and then provides the processed image data to the data driver 630. The timing controller 620 uses a synchronization signal SYNC (for example, a dot clock (DCLK), a data enable signal (DE), a horizontal synchronization signal (Hsync), and a vertical synchronization signal (Vsync)) input from outside of the display device 50 to generate a plurality of scanning control signals GCS and a plurality of data control signals DCS. The timing controller 620 provides the generated scanning control signal GCS and the data control signal DCS to the gate driver 610 and the data driver 630, respectively, for controlling the gate driver 610 and the data driver 630.

For example, the scanning control signal GCS provided by the timing controller 620 may be transmitted to each shift register unit 100 in the gate driving circuit 30 through the input signal line STV illustrated in FIG. 6 and serves as the input signal.

The technical effects and implementation principles of the display device 50 are basically the same as those of the display substrate 10 described in the embodiments of the present disclosure, and details are not described herein again.

For example, the display device 50 may further include other components, such as a signal decoding circuit, a voltage conversion circuit, etc. These components may use, for example, existing conventional elements, and the embodiments of the present disclosure are not limited in this aspect.

For example, the display device 50 may be any product or component with a display function, such as a liquid crystal panel, an electronic paper, an OLED panel, a mobile phone, a tablet computer, a television, a display, a notebook computer, a digital photo frame, a navigator, etc., and the embodiments of the present disclosure are not limited in this aspect.

At least an embodiment of the present disclosure further provides a display substrate, and the display substrate includes a base substrate and a shift register unit on the base substrate. The shift register unit includes an input circuit, an input control circuit, an output circuit, and an output terminal. The output circuit is electrically connected to the input circuit, the input control circuit, and the output terminal, respectively, and the output circuit is configured to output a second clock signal or a second power signal to the output terminal under control of an input signal provided by the input circuit and a first power signal provided by the input control circuit. The output circuit includes a fourth transistor, a fifth transistor, and an eighth transistor; a gate electrode of the fourth transistor is electrically connected to the input control circuit, a first electrode of the fourth transistor is electrically connected to a second power line, and a second electrode of the fourth transistor is electrically connected to a first electrode of the fifth transistor; a gate electrode of the fifth transistor is electrically connected to a second clock signal line, and a second electrode of the fifth transistor is electrically connected to a gate electrode of the eighth transistor; and a first electrode of the eighth transistor is electrically connected to the second clock signal line, and a second electrode of the eighth transistor is electrically connected to the output terminal. The first electrode of the eighth transistor is electrically connected to the gate electrode of the fifth transistor through a first connection component, the first connection component is electrically connected to the gate electrode of the fifth transistor through at least one first via hole, and an orthographic projection of the at least one first via hole on the base substrate is on a side, away from an orthographic projection of the gate electrode of the eighth transistor on the base substrate, of an orthographic projection of the gate electrode of the fifth transistor on the base substrate. For example, the first connection component is electrically connected to the gate electrode of the fifth transistor through the at least one first via hole, and the orthographic projection of the at least one first via hole on the base substrate is not between the orthographic projection of the gate electrode of the fifth transistor on the base substrate and the orthographic projection of the gate electrode of the eighth transistor on the base substrate.

Therefore, the arrangement of the position of the first via hole may reduce the width of the position occupied by the shift register unit in the display substrate, and may optimize the layout structure of the display substrate, thereby reducing the frame size of the display device including the display substrate to achieve the narrow frame design, and further reducing the manufacturing cost of the display substrate and the manufacturing cost of the display device including the display substrate.

For example, the display substrate provided by at least an embodiment of the present disclosure further includes a semiconductor layer, a first insulating layer, a first conductive layer, a second insulating layer, a second conductive layer, a third insulating layer, and a third conductive layer, which are provided on the base substrate in sequence. The gate electrode of the fifth transistor is in the first conductive layer, the first connection component is in the third conductive layer, and the at least one first via hole is in the second insulating layer and the third insulating layer, and is through the second insulating layer and the third insulating layer.

For example, in the display substrate provided by at least an embodiment of the present disclosure, the gate electrode of the fourth transistor is in the first conductive layer, the gate electrode of the fourth transistor is electrically connected to a second connection component through a fifth via hole, the second connection component is in the third conductive layer, and the fifth via hole is in the second insulating layer and the third insulating layer, and is through the second insulating layer and the third insulating layer. The second connection component is electrically connected to a third connection component through a sixth via hole, the third connection component is in the second conductive layer, and the sixth via hole is in the third insulating layer and penetrates the third insulating layer. The gate electrode of the fourth transistor and the gate electrode of the fifth transistor are arranged in the second direction in the first conductive layer, and an orthographic projection of the fifth via hole on the base substrate and an orthographic projection of the sixth via hole on the base substrate are arranged in the second direction.

For example, in the display substrate provided by at least an embodiment of the present disclosure, in a case where the at least one first via hole includes a plurality of first via holes, the plurality of first via holes are arranged in a first direction, and the first direction is perpendicular to the second direction.

At least an embodiment of the present disclosure further provides a manufacturing method of the display substrate according to any one of the embodiments of the present disclosure, and the manufacturing method includes: providing the base substrate, and forming a semiconductor layer, a first insulating layer, a first conductive layer, a second insulating layer, a second conductive layer, a third insulating layer, and a third conductive layer in a direction perpendicular to the base substrate in sequence. The power lines, the first signal line group, and the second signal line group are in the third conductive layer; the gate driving circuit is formed in the semiconductor layer, the first conductive layer, and the second conductive layer; and the gate driving circuit is respectively connected to the power line, the first signal line group, and the second signal line group through a plurality of via holes in the first insulating layer, the second insulating layer, and the third insulating layer.

For example, the first conductive layer of the gate driving circuit may be respectively connected to, for example, a first clock signal line and a second clock signal line in the first signal line group and a first power line and a second power line of the plurality of power lines through via holes penetrating the second insulating layer and the third insulating layer. The semiconductor layer of the gate driving circuit may be respectively connected to, for example, the first power line and the second power line of the plurality of power lines through via holes penetrating the first insulating layer, the second insulating layer, and the third insulating layer. The second conductive layer of the gate driving circuit may be connected to, for example, the second power line of the plurality of power lines through via holes penetrating the third insulating layer.

For example, the plurality of via holes located in the first insulating layer, the second insulating layer, and the third insulating layer may include the third via hole H3, the tenth via hole H10, and the like in the above embodiments.

The following statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced, that is, these accompanying drawings are not drawn according to actual scales. It should be understood that, in a case where a component or element such as a layer, film, area, substrate or the like is referred to be "on" or "under" another component or element, the component or element may be directly on or under the another component or element or a component or element is interposed therebetween.

(3) In case of no conflict, the embodiments of the present disclosure and features in one embodiment or in different embodiments can be combined to obtain new embodiments.

What have been described above are only specific implementations of the present disclosure, the protection scope of the present disclosure is not limited thereto. Any modifications or substitutions within the technical scope of the present disclosure easily obtained by those skilled in the art should be within the protection scope of the present disclosure. Therefore, the protection scope of the present disclosure should be based on the protection scope of the claims.

What is claimed is:

1. A display substrate, comprising:
a base substrate, comprising a pixel array region and a peripheral region,
a scan circuit and a plurality of power lines, in the peripheral region and on at least one side of the base substrate,
wherein the scan circuit comprises a plurality of cascaded shift register units, and each shift register unit comprises an input control circuit, an output circuit, and an input circuit;
the input control circuit is configured to input a first power signal to the output circuit in response to a first clock signal, the input circuit is configured to input an input signal to the output circuit in response to the first clock signal, and the output circuit is configured to output a second clock signal or a second power signal to an output terminal of the shift register unit under control of the input signal and the first power signal;
the output circuit comprises an output sub-circuit, a first output control sub-circuit, and a second output control sub-circuit;
the output sub-circuit is electrically connected to a first node and is configured to output the second clock signal to the output terminal under control of a level of the first node, the first output control sub-circuit is electrically connected to a second node and is configured to output the second power signal to the output terminal under control of a level of the second node, and the second output control sub-circuit is electrically connected to the first node, the second node and a third node and is configured to control the level of the first node and the level of the second node;
the input control circuit is electrically connected to the second node and is configured to write the first power signal to the second node under control of the first clock signal, and the input circuit is electrically connected to the third node and is configured to write the input signal to the third node under control of the first clock signal; and
the scan circuit comprises at least one transistor, an extending direction of a channel of the at least one transistor is parallel to an extending direction of at least one power line of the plurality of power lines, and the extending direction of the at least one power line is a second direction.

2. The display substrate according to claim 1, wherein the plurality of power lines are configured to provide a plurality of power signals to the plurality of cascaded shift register units comprised in the scan circuit;
the display substrate further comprises a first signal line group and a second signal line group which are in the peripheral region and on at least one side of the base substrate;
the first signal line group comprises at least one clock signal line, and the at least one clock signal line is configured to provide at least one clock signal to the plurality of cascaded shift register units comprised in the scan circuit;
the second signal line group comprises a trigger signal line, and the trigger signal line is configured to be connected to a first-stage shift register unit in the plurality of cascaded shift register units comprised in the scan circuit to provide a trigger signal to the first-stage shift register unit; and
the extending direction of the channel of the at least one transistor is further parallel to an extending direction of the at least one clock signal line.

3. The display substrate according to claim 2, wherein the at least one clock signal comprises the first clock signal or the second clock signal, and the plurality of power signals comprise the first power signal or the second power signal.

4. The display substrate according to claim 3, wherein the at least one clock signal line comprises a first clock signal line providing the first clock signal and a second clock signal line providing the second clock signal, and the plurality of power lines comprise a first power line providing the first power signal and a second power line providing the second power signal;
the output sub-circuit is electrically connected to the second clock signal line, the output terminal, and the first node, respectively;
the first output control sub-circuit is electrically connected to the second power line, the output terminal, and the second node, respectively;
the second output control sub-circuit is electrically connected to the first node, the second node, the third node, the first clock signal line, the second clock signal line, the first power line, and the second power line, respectively.

5. The display substrate according to claim 4, wherein the first output control sub-circuit comprises a third transistor, a gate electrode of the third transistor is electrically connected to the second node, a first electrode of the third transistor is electrically connected to the second power line, and a second electrode of the third transistor is electrically connected to the output terminal;

the second output control sub-circuit comprises a fourth transistor, a fifth transistor, a sixth transistor, and a seventh transistor;

a gate electrode of the fourth transistor is electrically connected to the second node, a first electrode of the fourth transistor is electrically connected to the second power line, and a second electrode of the fourth transistor is electrically connected to a first electrode of the fifth transistor;

a gate electrode of the fifth transistor is electrically connected to the second clock signal line, and a second electrode of the fifth transistor is electrically connected to the third node;

a gate electrode of the sixth transistor is electrically connected to the first power line, a first electrode of the sixth transistor is electrically connected to the third node, and a second electrode of the sixth transistor is electrically connected to the first node;

a gate electrode of the seventh transistor is electrically connected to the third node, a first electrode of the seventh transistor is electrically connected to the first clock signal line, and a second electrode of the seventh transistor is electrically connected to the second node; and the output sub-circuit comprises an eighth transistor, a gate electrode of the eighth transistor is electrically connected to the first node, a first electrode of the eighth transistor is electrically connected to the second clock signal line, and a second electrode of the eighth transistor is electrically connected to the output terminal.

6. The display substrate according to claim 5, further comprising: a semiconductor layer, a first insulating layer, a first conductive layer, a second insulating layer, a second conductive layer, a third insulating layer, and a third conductive layer, wherein the semiconductor layer is on the base substrate, the first insulating layer is on a side of the semiconductor layer away from the base substrate, the first conductive layer is on a side of the first insulating layer away from the semiconductor layer, the second insulating layer is on a side of the first conductive layer away from the first insulating layer, the second conductive layer is on a side of the second insulating layer away from the first conductive layer, the third insulating layer is on a side of the second conductive layer away from the second insulating layer, and the third conductive layer is on a side of the third insulating layer away from the second conductive layer.

7. The display substrate according to claim 6, wherein the first electrode of the eighth transistor is electrically connected to the gate electrode of the fifth transistor through a first connection component;

the gate electrode of the fifth transistor is in the first conductive layer, and the first connection component is in the third conductive layer;

the first connection component is electrically connected to the gate electrode of the fifth transistor through at least one first via hole, and the at least one first via hole is in the second insulating layer and the third insulating layer, and penetrates the second insulating layer and the third insulating layer; and an orthographic projection of the at least one first via hole on the base substrate is on a side of an orthographic projection of the gate electrode of the fifth transistor on the base substrate away from an orthographic projection of the gate electrode of the eighth transistor on the base substrate in a first direction perpendicular to the second direction.

8. The display substrate according to claim 7, wherein in a case where the at least one first via hole comprises a plurality of first via holes, the plurality of first via holes are arranged in the first direction.

9. The display substrate according to claim 7, wherein in a case where the input control circuit comprises a first transistor, the gate electrode of the fourth transistor is electrically connected to a second electrode of the first transistor and the second electrode of the seventh transistor through a second connection component, a third connection component, and a fourth connection component;

the second connection component and the fourth connection component are in the third conductive layer, and the third connection component is in the second conductive layer;

the gate electrode of the fourth transistor is in the first conductive layer, the gate electrode of the fourth transistor is electrically connected to the second connection component through a fifth via hole, and the fifth via hole is in the second insulating layer and the third insulating layer, and penetrates the second insulating layer and the third insulating layer;

the second connection component is electrically connected to the third connection component through a sixth via hole, and the sixth via hole is in the third insulating layer and penetrates the third insulating layer;

the third connection component is electrically connected to the fourth connection component through a seventh via hole, and the seventh via hole is in the third insulating layer and penetrates the third insulating layer; and the second electrode of the first transistor and the second electrode of the seventh transistor are in the semiconductor layer, the second electrode of the first transistor is electrically connected to the fourth connection component through an eighth via hole, the second electrode of the seventh transistor is electrically connected to the fourth connection component through a ninth via hole, and the eighth via hole and the ninth via hole are in the first insulating layer, the second insulating layer, and the third insulating layer, and penetrate the first insulating layer, the second insulating layer, and the third insulating layer.

10. The display substrate according to claim 9, wherein the fifth via hole and the sixth via hole are arranged in the second direction.

11. The display substrate according to claim 2, wherein a control terminal of the input control circuit is configured to receive the first clock signal, the control terminal of the input control circuit comprises a main body portion, and an extending direction of the main body portion is in a straight line.

12. The display substrate according to claim 11, wherein the input control circuit comprises a first transistor, and a gate electrode of the first transistor is the control terminal of the input control circuit;

the gate electrode of the first transistor comprises a first gate portion, and the first gate portion is the main body portion;

the extending direction of the main body portion is a first direction, and the first direction is perpendicular to the second direction;

the first transistor is configured as the at least one transistor, and an extending direction of a channel of the first transistor is a direction from a first electrode of the first transistor to a second electrode of the first transistor; and a distance between an orthographic projection of the first gate portion on the base substrate and an orthographic projection of the first electrode of the first transistor on the base substrate in the second direction is a first certain value, and a distance between the orthographic projection of the first gate portion on the base substrate and an orthographic projection of the second electrode of the first transistor on the base substrate in the second direction is a second certain value.

13. The display substrate according to claim 12, wherein the control terminal of the input control circuit further comprises a protruding portion, and the protruding portion is electrically connected to the main body portion;

the gate electrode of the first transistor further comprises a second gate portion, and the second gate portion is the protruding portion; and in the second direction, at least a portion of an orthographic projection of the second gate portion on the base substrate is between the orthographic projection of the first electrode of the first transistor on the base substrate and the orthographic projection of the second electrode of the first transistor on the base substrate.

14. The display substrate according to claim 12, wherein a control terminal of the input circuit is configured to receive the first clock signal, and an extending direction of the control terminal of the input circuit is in a straight line.

15. The display substrate according to claim 14, wherein an extending direction of the control terminal of the input control circuit is the first direction.

16. The display substrate according to claim 14, wherein the input circuit comprises a second transistor, the control terminal of the input circuit comprises a gate electrode of the second transistor, and the gate electrode of the first transistor and the gate electrode of the second transistor are arranged in the first direction;

each of the plurality of cascaded shift register units further comprises a first wiring portion, the first gate portion of the gate electrode of the first transistor is directly connected to a first end of the first wiring portion, the gate electrode of the second transistor is directly connected to a second end of the first wiring portion, and the first wiring portion extends in a straight line along the first direction; and each of the plurality of cascaded shift register units further comprises a second wiring portion, the second wiring portion is electrically connected to the first wiring portion, and the second wiring portion extends along the second direction.

17. The display substrate according to claim 12, wherein each of the plurality of cascaded shift register units further comprises a third wiring portion, and the third wiring portion extends along the first direction;

a first end of the third wiring portion is electrically connected to the first clock signal line providing the first clock signal, and a second end of the third wiring portion is electrically connected to the gate electrode of the first transistor; and the third wiring portion is configured to transmit the first clock signal provided by the first clock signal line to the gate electrode of the first transistor.

18. A display substrate, comprising: a base substrate and a shift register unit on the base substrate, wherein the shift register unit comprises an input circuit, an input control circuit, an output circuit, and an output terminal;

the output circuit is electrically connected to the input circuit, the input control circuit, and the output terminal, respectively, and the output circuit is configured to output a second clock signal or a second power signal to the output terminal under control of an input signal provided by the input circuit and a first power signal provided by the input control circuit;

the output circuit comprises a fourth transistor, a fifth transistor, and an eighth transistor;

a gate electrode of the fourth transistor is electrically connected to the input control circuit, a first electrode of the fourth transistor is electrically connected to a second power line, and a second electrode of the fourth transistor is electrically connected to a first electrode of the fifth transistor;

a gate electrode of the fifth transistor is electrically connected to a second clock signal line, and a second electrode of the fifth transistor is electrically connected to a gate electrode of the eighth transistor;

a first electrode of the eighth transistor is electrically connected to the second clock signal line, and a second electrode of the eighth transistor is electrically connected to the output terminal;

the first electrode of the eighth transistor is electrically connected to the gate electrode of the fifth transistor through a first connection component, and the first connection component is electrically connected to the gate electrode of the fifth transistor through at least one first via hole; and an orthographic projection of the at least one first via hole on the base substrate is not between an orthographic projection of the gate electrode of the fifth transistor on the base substrate and an orthographic projection of the gate electrode of the eighth transistor on the base substrate.

19. The display substrate according to claim 18, further comprising: a semiconductor layer, a first insulating layer, a first conductive layer, a second insulating layer, a second conductive layer, a third insulating layer, and a third conductive layer, which are provided on the base substrate in sequence, the gate electrode of the fifth transistor is in the first conductive layer, the first connection component is in the third conductive layer, and the at least one first via hole is in the second insulating layer and the third insulating layer, and penetrates the second insulating layer and the third insulating layer.

20. The display substrate according to claim 19, wherein the gate electrode of the fourth transistor is in the first conductive layer;

the gate electrode of the fourth transistor is electrically connected to a second connection component through a fifth via hole, the second connection component is in the third conductive layer, and the fifth via hole is in the second insulating layer and the third insulating layer, and penetrates the second insulating layer and the third insulating layer;

the second connection component is electrically connected to a third connection component through a sixth via hole, the third connection component is in the second conductive layer, and the sixth via hole is in the third insulating layer and penetrates the third insulating layer;

the gate electrode of the fourth transistor and the gate electrode of the fifth transistor are arranged in the second direction in the first conductive layer;

an orthographic projection of the fifth via hole on the base substrate and an orthographic projection of the sixth via hole on the base substrate are arranged in the second direction; and wherein in a case where the at least one first via hole comprises a plurality of first via holes, the plurality of first via holes are arranged in a first direction, and the first direction is perpendicular to the second direction.

* * * * *